(12) United States Patent
Chou

(10) Patent No.: US 9,966,216 B2
(45) Date of Patent: May 8, 2018

(54) PHOTO-ELECTRON SOURCE ASSEMBLY WITH SCALED NANOSTRUCTURES AND NANOSCALE METALLIC PHOTONIC RESONANT CAVITY, AND METHOD OF MAKING SAME

(71) Applicant: Princeton University, Princeton, NJ (US)

(72) Inventor: Stephen Y. Chou, Princeton, NJ (US)

(73) Assignee: Princeton University, Princeton, NJ (US)

( * ) Notice: Subject to any disclaimer, the term of this patent is extended or adjusted under 35 U.S.C. 154(b) by 123 days.

(21) Appl. No.: 14/356,361

(22) PCT Filed: Nov. 5, 2012

(86) PCT No.: PCT/US2012/063623
§ 371 (c)(1),
(2) Date: May 5, 2014

(87) PCT Pub. No.: WO2013/067541
PCT Pub. Date: May 10, 2013

(65) Prior Publication Data
US 2016/0133424 A1 May 12, 2016

Related U.S. Application Data

(60) Provisional application No. 61/555,995, filed on Nov. 4, 2011.

(51) Int. Cl.
*H01J 1/304* (2006.01)
*H01J 9/02* (2006.01)
*H01L 33/38* (2010.01)
*H01L 51/44* (2006.01)
*H01L 51/52* (2006.01)
*H01L 51/00* (2006.01)
*H01L 51/42* (2006.01)

(52) U.S. Cl.
CPC ............ *H01J 1/3042* (2013.01); *H01J 9/025* (2013.01); *H01L 33/38* (2013.01); *H01L 51/442* (2013.01);
(Continued)

(58) Field of Classification Search
CPC .......... H01J 1/3042; H01J 40/04–40/06; H01J 1/34; H01J 2201/3423; H01L 2933/0083; H01L 51/442; H01L 51/445
See application file for complete search history.

(56) References Cited

U.S. PATENT DOCUMENTS 5,226,053 A 7/1993 Cho et al.
6,002,141 A * 12/1999 Niigaki .................... H01J 1/34
257/10
(Continued)

FOREIGN PATENT DOCUMENTS

CN 202004040 U 10/2011
JP 2005317959 A 11/2005
(Continued)

OTHER PUBLICATIONS

International Search Report from corresponding International Application No. PCT/US2012/063623, dated Mar. 29, 2013.
(Continued)

*Primary Examiner* — Raj R Gupta
(74) *Attorney, Agent, or Firm* — Charles H. Rexer, Jr.

(57) ABSTRACT

A new ultra-thin high-efficiency photoelectron source utilizing a metallic photonic resonant cavity having a photonic resonant cavity with a top metallic layer with a plurality of openings, each having an average dimension less than the wavelength of the excitation photons in vacuum, a bottom metallic layer and a photoelectron emission layer of semiconductor positioned between the top metallic layer and the bottom metallic.

44 Claims, 24 Drawing Sheets

(52) U.S. Cl.
    CPC ...... *H01L 51/5209* (2013.01); *H01L 51/0036* (2013.01); *H01L 51/4253* (2013.01); *H01L 2933/0016* (2013.01); *H01L 2933/0083* (2013.01); *Y02E 10/549* (2013.01); *Y02P 70/521* (2015.11)

(56) References Cited

U.S. PATENT DOCUMENTS

| | | |
|---|---|---|
| 2006/0138395 A1* | 6/2006 | Kohno .................... H01J 1/34 257/10 |
| 2011/0024778 A1 | 2/2011 | Barnes et al. |
| 2014/0024165 A1* | 1/2014 | Masunaga ....... H01L 31/022433 438/72 |

FOREIGN PATENT DOCUMENTS

| | | | |
|---|---|---|---|
| WO | WO 2010106718 A1 * | 9/2010 | ..... H01L 31/022433 |
| WO | 2010117280 A1 | 10/2010 | |
| WO | 2011030011 A2 | 3/2011 | |
| WO | 2011093885 A1 | 8/2011 | |

OTHER PUBLICATIONS

U. Geyer et al. "Nano-Structured Metallic Electrodes for Plasmonic Optimized Light Emitting Diodes." In: Plasmonics: Metallic Nanostructures and Their Optical Properties VI. Edited by Mark I. Stockman: Proc. of SPIE, 2008, vol. 7032, 70320B, pp. 1-10.
Chinese Office Action from corresponding Chinese Application No. 201280066178.5, dated Jul. 26, 2016.

* cited by examiner

PHOTO-ELECTRON SOURCE ASSEMBLY WITH SCALED NANOSTRUCTURES AND NANOSCALE METALLIC PHOTONIC RESONANT CAVITY, AND METHOD OF MAKING SAME

CROSS-REFERENCE TO RELATED APPLICATIONS

This application is a National Stage of International Application No. PCT/US12/63623, filed Nov. 5, 2012, which claimed the benefit of U.S. Provisional Application No. 61/555,995, filed on Nov. 4, 2011. The disclosure of the above applications are incorporated herein by reference.

FIELD

The present disclosure relates to electrical devices and process of making them and, more specifically, to a nanostructured photo-electric devices.

BACKGROUND

The statements in this section merely provide background information related to the present disclosure and may not constitute prior art.

The overall disclosure is related to a new light emitting diode (LED), photoelectron source, and photodetector (i.e., solar cell) of high-performance and the methods of making same. Each of the three types of devices has its own unique design and fabrication, while they share the use of a general architecture of a nanoscale metallic photonic resonant cavity and certain nanofabrication methods. However, it should be pointed out that for each device type, the photonic cavity has been tailored to have special properties and/or functions that other device types do not possess, and the same or similar nanofabrication methods have been used in different forms and/or sequences special to each particular device type. For examples, for LEDs, the photonic cavity is used as antenna for enhancing the radiation of light generated inside of the cavity; while for the photoelectron source and the photodetector, the photonic cavity is used as good light absorber and trapper for enhancing the light transmission from outside of the cavity into inside, the trapping light inside the cavity, and the total light absorption by a semiconductor(s) inside of the cavity. For the photoelectron source, the semiconductor inside the photonic cavity is further configured to have thin thickness and short carrier lifetime to shorten the photoelectron pulse width and to reduce the photoelectron energy and emittance spread (i.e., variation). The particular background for each device is discussed separately below.

(1) Light Emitting Diode (LED)

In one embodiment, this disclosure is related to a new light emitting of high-performance and the methods of making same. Various embodiments of the described invention can solve the challenges in a conventional LEDs, either individually or together, that include how to (a) enhance light radiation in light emitting material, (b) effectively extract the light from the inside of the light-emitting material to outside; (c) replace indium-tin-oxide (ITO) transparent electrode; (d) when pumped by a light source not by an electric current, achieve (i) high light transmission from the outside to inside of the LED and (ii) high light trapping and absorption in a very thin light generating material of the LED to maximize the quantum efficiency (the efficiency of converting the incoming light to the emitted light by the material), and (e) better cooling.

To overcome these issues, the light emitting diode (LED) described herein uses a metallic photonic resonant cavity antenna to greatly enhance the extraction of light from the light-emitting material inside of the cavity to the free space outside of the cavity antenna, and use subwavelength metal mesh to replace ITO.

(2) Photoelectron Source

In another embodiment, this disclosure is related to a new semiconductor photoelectron source of high-performance and the methods of making same. A semiconductor photoelectron source uses a semiconductor to convert incoming photons to electrons, and have the electrons going out of the semiconductor into a free space for a further use. The further use includes electron microscopy, electron lithography, and generation of x-ray using electron beam. Often the electrons in the free space get further extracted, focused and accelerated.

The current disclosed embodiment of this invention is to solve the challenges in a conventional semiconductor photoelectron source, either individually or together, that include how to (a) shorten the photoelectron pulse, (b) reduce photoelectron energy spread, (c) reduce emittance, (d) increase quantum efficiency (the efficiency of converting the incoming photons to photoelectrons. High quantum efficiency can reduce the power of a pumping laser/lamp that provides incoming photons), (e) better cooling, (f) long photoelectron source lifetime, and (g) less laser jitter.

For examples, conventional semiconductor photoelectron source designs, limited by intrinsic principles, have several drawbacks. A conventional semiconductor photoelectron source uses a thick semiconductor layer (or a bulk) for photoelectron emission material, excited by a pulsed laser which is focused and shaped by conventional diffractive-limited optics without any light resonant cavity. The major drawbacks for such approach include (i) long electron pocket length (>10 ps); (ii) large longitudinal emittance; (iii) less than 5% quantum efficiency; (iv) strong image charge effect; (v) poor cooling to GaAs surface and hence limited life-time; (vi) the minimum laser spot size (hence electron beam transverse size), set by the light diffractive limit, is about 1 micron; and (vii) laser beam jitter (due to vibration) which further prevents a use of a small diameter beam line.

To overcome the challenges, some embodiments of the invention described herein uses different physical principles and designs that are paradigm shifts from the conventional approaches. Various embodiments of the photoelectron source as described herein can have seven (7) elements that a conventional photoelectron sources does not have to overcome these challenges. They include one or more of: (1) the photoelectron emission semiconductor (GaAs) layer (less than or equal to about 100 nm) is ultra-thin much less than light absorption length, (2) the photoelectron emission semiconductor layer also has ultra-short carrier lifetime (e.g., less than about 0.2 ps), (3) a resonant cavity (formed by the metallic lens, the GaAs and a metallic backplane) to enhance the light transmission into the GaAs and the absorption of the majority of incoming fs laser pulse in the GaAs (greater than about 80%)—hence greatly improving quantum efficiency, (4) plasmonic subwavelength lens(es) (made of Au) on top of the GaAs to focus and shape the light into a (an array of) hole(s) of subwavelength size, (5) a metallic backplane under the thin GaAs to reduce image charge effect, enhance cooling and light harvesting, (6) an additional voltage applied between the top metal and the back metallic plane to create an additional electrical field inside the GaAs for better electron extraction, and (7) a segmented aperture array to divide incoming light into subwavelength pockets.

(3) Photodetector (Solar Cell)

In another embodiment of the invention as described herein is a new photodetector of high-performance and the methods of making same. The new photodetector also can be a high performance solar cell, and therefore the wording "photodetector" and "solar cell" are interchangeable in the specification.

Some of these embodiments can solve the challenges in a conventional photodetectors, either individually or together, that include how to (a) achieve high light transmission from outside of the photodetector to inside, (b) achieve high light trapping and absorption in a photodetector where a light photodetection material in the photodetector has a thickness only a fraction of the light absorption-length in the photodetection material, (c) replace indium-tin-oxide (ITO) transparent electrode, and (d) provide better cooling. The improvement in (a) and (b) can greatly improve the quantum efficiency (converting photons to electrons) and hence power conversion efficiency, leading to cheaper and more economical viable photodetectors/solar cells. The improvement in (c) can lengthen the photodetector lifetime (i.e., the length of usage) as well as improve photon to electron conversion performances, which is temperature dependent.

As such, the inventors have invented and demonstrated a new ultra-thin high-efficiency photodetector (i.e., solar cell (SC)), termed "plasmonic cavity with subwavelength hole-array (PlaCSH) solar cell", that offers a solution to all three issues with unprecedented performances. PlaCSH-SC consists of a metallic photonic resonant cavity comprising: a 30 nm thick metal-mesh electrode with subwavelength hole-array (MESH) that replaces ITO, a metal back electrode, and in-between a polymer photovoltaic active layer of 85 nm thick (⅓ average absorption-length). Experimentally, PlaCSH-SCs achieved light coupling-efficiency/absorptance as high as 96%, average 90%, broad-band, and Omni acceptance (light coupling nearly independent of both light incident angle and polarization); and an external quantum efficiency of 69% for only 27% single-pass active layer absorptance; leading to a standard-solar-irradiation power conversion efficiency (PCE) of 52% higher than the reference ITO-SC (identical structure and fabrication to PlaCSH-SC except MESH replaced by ITO). The Omni acceptance of PlaCSH is over 2 fold lower in high angle reflectance than Si subwavelength antireflection, yet PlaCSH has a thickness over 10 fold thinner, and can, in harvesting scattered light, increase PCE by additional 81% over ITO-SC, leading to a total 175% increase. Furthermore, we found that the light reflection and absorption by MESH after formation of PlaCSH are reduced by 2 to 6 fold from the values when it is alone; while the sheet resistance of MESH is 2.2 ohm/sq or less—over 4.5 fold better than ITO film, giving a lowest reflectance-sheet-resistance product. Fabrication of PlaCSH used nanoimprint on 4" wafer and is scalable to roll-to-roll manufacturing. The designs, fabrications, and findings are applicable to thin solar cells in other materials.

SUMMARY

The inventors hereof has succeeded in designing new light emitting diodes, fast photo-electron source and photo-detectors using scaled nanostructures and nanoscale metallic photonic cavity and antenna, and in developing new methods of making same.

(1) Light Emitting Diode (LED)

Some embodiments described herein related to a new light emitting of high-performance and the methods of making same. The light emitting diode (LED) embodiments of the invention uses a metallic photonic resonant cavity antenna to greatly enhance the radiation from the light emitting material and the extraction of light from the light-emitting material inside of the cavity to the free space outside of the cavity antenna, and use subwavelength metal mesh to replace ITO.

(2) Photoelectron Source

Some embodiments described herein related to a new semiconductor photoelectron source of high-performance and the methods of making same. The photoelectron source can have one or more of seven (7) elements that a conventional photoelectron sources does not have to overcome the challenges. They are: (1) the middle function layer is an ultra-thin photoelectron emission semiconductor (GaAs) layer (less than or equal to about 100 nm) which is much less than light absorption length, (2) the ultra-thin photoelectron emission semiconductor layer also has ultra-short carrier lifetime (e.g., less than about 0.2 ps), (3) a resonant cavity (formed by the plasmonic lens, the GaAs and the backplane) to absorb the majority of incoming fs laser pulse in the GaAs (greater than about 80%)—hence greatly improving quantum efficiency, (4) plasmonic subwavelength lens(es) (made of Au) on top of the GaAs to focus and shape the light into a (an array of) hole(s) of subwavelength size and to greatly enhance light transmission to GaAs, (5) a metal backplane under the thin GaAs to reduce image charge effect, enhance cooling and light harvesting, (6) an additional voltage applied between the top metal and the back metal backplane to create an additional electrical field inside the GaAs for better electron extraction, and (7) a segmented aperture array to divide incoming light into subwavelength pockets.

(3) Photodetector (Solar Cell)

Some embodiments described herein are related to a new photodetector of high-performance and the methods of making same. The new photodetector also can be a high performance solar cell, and therefore the wording "photodetector" and "solar cell" are interchangeable in the specification.

The inventors have invented and demonstrated a new ultra-thin high-efficiency photodetector (i.e., solar cell (SC)), termed "plasmonic cavity with subwavelength hole-array (PlaCSH) solar cell", that offers a solution to all three issues with unprecedented performances. PlaCSH-SC consists of a metallic photonic resonant cavity having an metal-mesh electrode of about 30 nm in thickness with subwavelength hole-array (MESH) that replaces ITO, a metal back electrode, and in-between a polymer photovoltaic active layer of about 85 nm thick (⅓ average absorption-length). Experimentally, PlaCSH-SCs achieved light coupling-efficiency/absorptance as high as 96%, average 90%, broad-band, and Omni acceptance (light coupling nearly independent of both light incident angle and polarization); and an external quantum efficiency of 69% for only 27% single-pass active layer absorptance; leading to a standard-solar-irradiation power conversion efficiency (PCE) of 52% higher than the reference ITO-SC (identical structure and fabrication to PlaCSH-SC except MESH replaced by ITO). The Omni acceptance of PlaCSH is over 2 fold lower in high angle reflectance than Si subwavelength antireflection, yet PlaCSH has a thickness over 10 fold thinner, and can, in harvesting scattered light, increase PCE by additional 81% over ITO-SC, leading to a total 175% increase. Furthermore, we found that the light reflection and absorption by MESH after formation of PlaCSH are reduced by 2 to 6 fold from the values when it is alone; while the sheet resistance of MESH is 2.2 ohm/sq or less—over 4.5 fold better than ITO film, giving a lowest reflectance-sheet-resistance product. Fabrication of PlaCSH used nanoimprint on 4" wafer and is scalable to roll-to-roll manufacturing. The designs, fabrications, and findings are applicable to thin solar cells in other materials.

According to one aspect, a light emitting diode (LED) assembly including a photonic resonant cavity antenna having a top metallic layer that is light transmissive, a bottom metallic layer, and a light emitting material layer of semiconductor positioned between the top metallic layer and the bottom metallic layer for producing light.

In another aspect, a method of manufacturing a light emitting diode (LED) assembly having a photonic resonant cavity antenna including a top metallic layer that is light transmissive, a bottom metallic layer, and a light emitting material layer of semiconductor positioned between the top metallic layer and the bottom metallic layer wherein the method includes growing the light emitting material layer using at least one of low temperature molecule beam epitaxy and thin film deposition.

According to another aspect, a photoelectron source assembly including a photonic resonant cavity having a top metallic layer that is light transmissive, a bottom metallic layer, and a photoelectron emission layer of semiconductor positioned between the top metallic layer and the bottom metallic layer for producing photoelectrons.

According to yet another aspect, a method of manufacturing a photoelectron source assembly having a photonic resonant cavity including a top metallic layer that is light transmissive, a bottom metallic layer, and an photoelectron emission layer of semiconductor positioned between the top metallic layer and the bottom metallic layer, the semiconductor producing photoelectrons, the method including growing the photoelectron emission layer using low temperature molecule beam epitaxy.

According to still another aspect, a photodetector assembly including a photonic resonant cavity having a top metallic layer that is light transmissive, a bottom metallic layer, and an light detection layer of semiconductor positioned between the top metallic layer and the bottom metallic layer, the semiconductor producing an electric charge under irradiation of incoming photons.

In still another aspect, a method of manufacturing a photodetector assembly having a photonic resonant cavity including a top metallic layer that is light transmissive, a bottom metallic layer, and an light detection layer of semiconductor positioned between the top metallic layer and the bottom metallic layer, the semiconductor producing an electric charge under irradiation of incoming photons the method including growing the light detection layer using at least one of low temperature molecule beam epitaxy and thin film deposition.

In another aspect, an electrical conducting metallic layer assembly that is transmissive of light having a defined wavelength, The electrical conducting metallic layer assembly including a thin continuous metallic layer with a plurality of apertures wherein each aperture is separated from another one of the apertures by a distance that is less than the defined wavelength of the light.

In yet another aspect, a method of manufacturing an electrical conducting metallic layer assembly that is transmissive of light having a defined wavelength that includes a thin continuous metallic layer with a plurality of apertures wherein each aperture is separated from another one of the apertures by a distance that is less than the defined wavelength of the light, the method including fabricating the continuous metallic layer and defining the plurality of apertures that are separated from one another by a distance that is less than the defined wavelength of light, by at least one method selected from the group of nanoimprinting, electron beam lithography, ion beam lithography, optical lithography, and self-assembly.

Further aspects of the present disclosure will be in part apparent and in part pointed out below. It should be understood that various aspects of the disclosure may be implemented individually or in combination with one another. It should also be understood that the detailed description and drawings, while indicating certain exemplary embodiments, are intended for purposes of illustration only and should not be construed as limiting the scope of the disclosure.

BRIEF DESCRIPTION OF THE DRAWINGS

It should be understood that throughout the drawings, corresponding reference numerals indicate like or corresponding parts and features.

DETAILED DESCRIPTION

The following description is merely exemplary in nature and is not intended to limit the present disclosure or the disclosure's applications or uses.

(1) Light Emitting Diode (LED)

Figure 1:
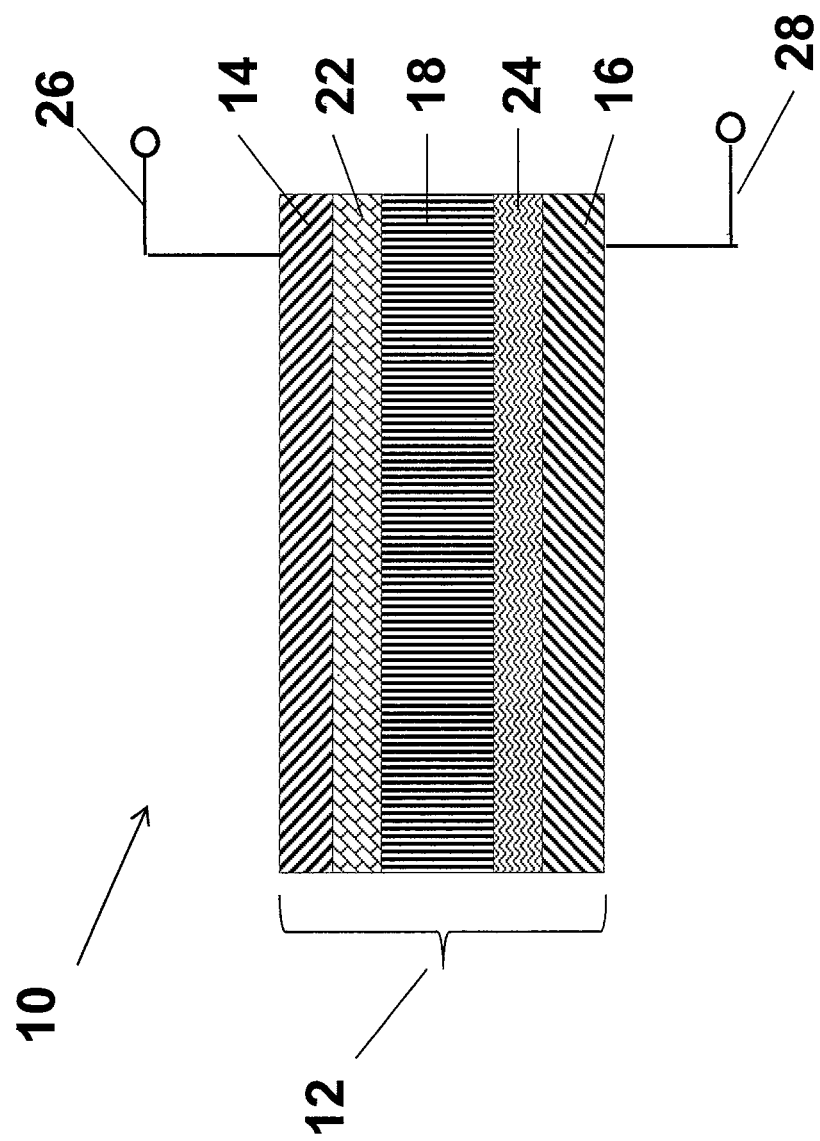
FIG. 1 is a schematic of light emitting diode. Plasmonic Cavity with an active Layer, a top metallic layer of subwavelength nanostructures that at least partially transmits light, and a bottom metallic layer.

As shown in FIG. 1, the light emitting diode (LED) 10 embodiment of the invention, also termed "plasmonic cavity with subwavelength hole-array light emitting diode (PlaCSH)-LED", includes a metallic photonic resonant cavity antenna 12 comprising: a thin top metallic layer that is light transmissive 14, a bottom metallic layer 16, and a light-emitting material layer 18 is positioned between the top and bottom layers, and the photon-emission material layer 18 that can emit photons upon either flowing an electric current or irradiated by an incoming photons. Besides being used as a part the photonic cavity antenna 12, the top metallic layer 14 and the bottom metallic layer 16, each serves as an electrode to the LED 10, by connecting to electric lead 26 and 28. The electrodes can supply electric current to the LED 10 for emitting light. Clearly, the top metallic layer 14 also serves as a light transmissive electrode that allows light either radiates to outside of the cavity or transmits from outside to inside of the cavity. The photonic cavity antenna 12, the top metallic layer 14 and the bottom metallic layer 16 also can provide good cooling to the LED 10.

Optionally, the light-emitting material layer 18 may have a top interface layer 22 on its top surface, and a bottom interface layer 24 on its bottom surface. The top and bottom interface layers 22 and 24 are for providing good adhesions between layers (serving as adhesion layer), blocking/transporting a particular electrical charge carrier type (serving as charge carrier blocking/transporting layer), or enhancing the performance of the cavity antenna (serving as a spacer). The spacer might be needed in a metallic photonic cavity to reduce certain quenching of light by metal.

The LED 10 operates in the flowing way. (a) In the electrical current pumping mode, a voltage is applied between the top metallic layer 14 and the bottom metallic layer 16, through the leads 26 and 28, causing an electric current flowing through the light-emitting layer 18 to generate photons (i.e., light). The metallic photonic resonant cavity antenna 12 enhances the radiation from the photo-emission material and the extraction of light from the light-emitting material 18 inside of the cavity to the free space outside of the cavity antenna 12. The enhancement of extraction means that for a given light-emitting material (and the same geometry) and a given voltage biasing condition, the LED with the cavity antenna radiates and extracts more light out to the free space than the LED without the cavity antenna. The light that cannot be extracted out will become the heat, which can significantly reduce the LED operation lifetime and performance (since performance is temperature dependent).

(b) In the optical pumping mode, a light is irradiated from outside of the LED 10 to inside to produce a light in the light-emitting material 18 (no electrical current is needed). In this operation mode, in addition to enhance the light extraction at emission wavelength, the cavity antenna 12 also enhance the light transmission at pumping wavelength from the outside of the cavity through the light transmissive electrode into the cavity (which means that light transmission will larger with the cavity than that just the light transmissive electrode alone without a cavity), and enhance the trapping and absorption of the pumping light inside of the cavity (due to the multiple light reflection inside the cavity).

The bottom metallic layer 16 comprises a metallic material, a mixture of metallic materials, or multilayers of metallic materials. The bottom metallic layer can be flat or structured. The property of metallic material is essential to the desired property of the photonic resonant cavity antenna (e.g., enhanced light extraction, transmission and trapping). By a material being "metallic", it means that the material not only conducts electric current, but also behaves like a metal under a light radiation, when the wavelength (frequency) of the light is longer (lower) than the plasmon wavelength (frequency) of the metal, so that the free electrons in the metal can respond to the oscillation of incoming light, strongly reflecting the light backward. However, if the wavelength (frequency) of the incoming light is shorter (higher) than the plasmon wavelength (frequency) of the metal, so that the free electrons in the metal cannot respond to the oscillation of incoming light, it behaves like a dielectric and becomes transparent to the incoming light. For examples, bulk gold, having a plasmon wavelength at about 540 nm, is "metallic" and light will strongly reflected back for the light with a wavelength longer than about 540 nm; but becomes transparent to the incoming light if the light with a wavelength is much shorter than 560 nm. Other example is that indium-tin-oxide (ITO) has a plasmon wavelength at about 1.8 um, hence at a visible light wavelength (400 to 700 nm) an ITO layer, although electrical conducting, is transparent and is not metallic. (Note the photons and light are interchangeable in the description).

Depending upon the working photon wavelength, the metallic materials for the bottom metallic layer 16 are chosen from the materials that are metallic in the working photon wavelength. For examples, the metallic materials can be selected from gold, copper, silver, aluminum, their mixture, alloys, and multilayers in visible light ranges and longer wavelength range, and ITO, certain metal oxides, for near or mid infrared wavelength or longer wavelengths. Silicon can become metallic in certain light wavelength range. For the photonic property of the cavity, the thickness of the bottom metallic layer is insignificant, since the photonic role of the bottom metallic layer is to reflect the photons. But the thickness is significant for fabrication, flexibility, and cooling. For easy fabrication or flexibility, the thickness of the bottom metallic layer is from 5 nm to 5 microns. Furthermore, the selection of metallic material needs to consider the energy band matching between the materials for a metallic layer and an active layer.

Figure 2:
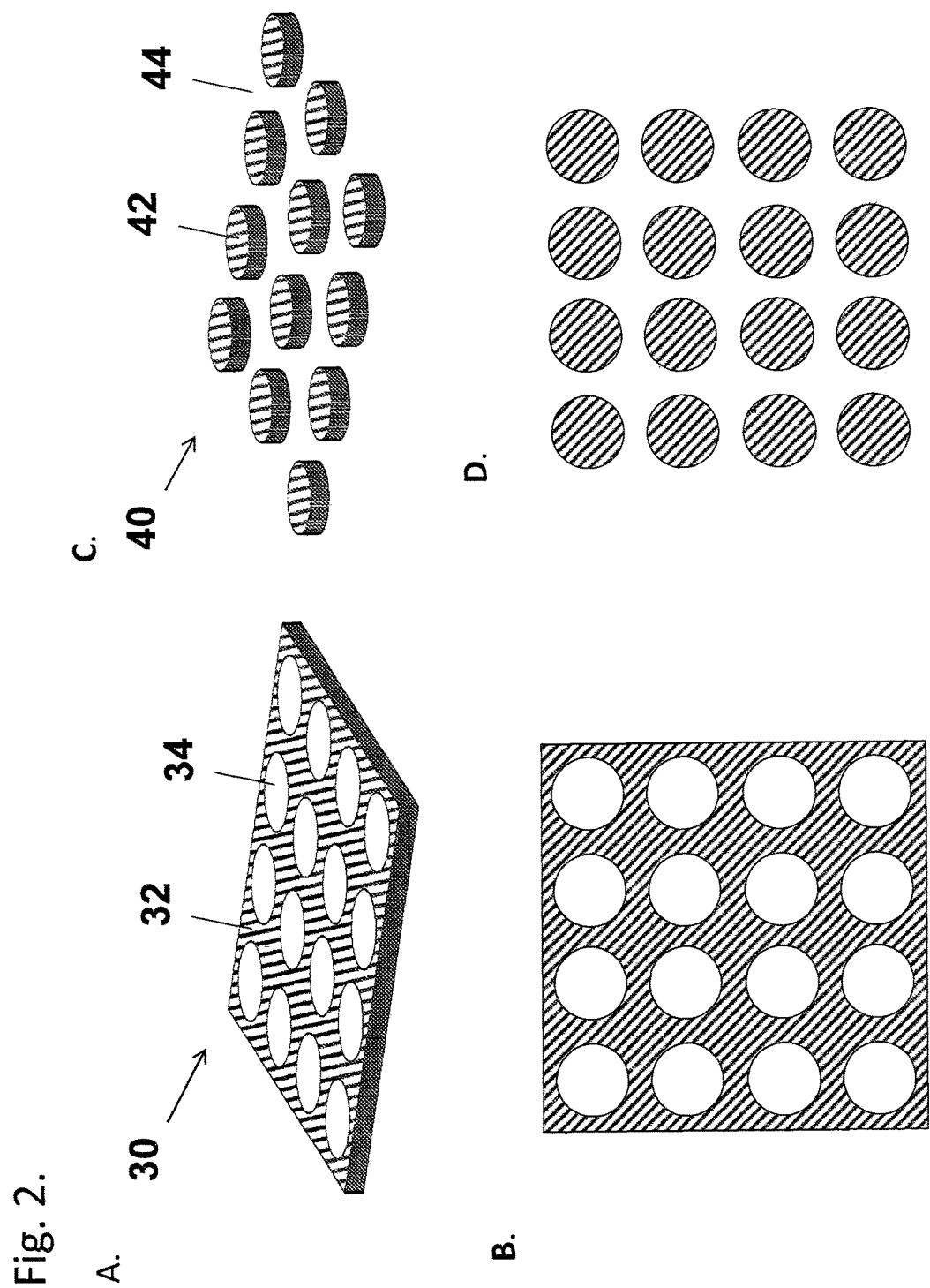
FIG. 2 is a schematic of the top metallic layer of a metallic plasmonic resonant cavity.
Figure 3:
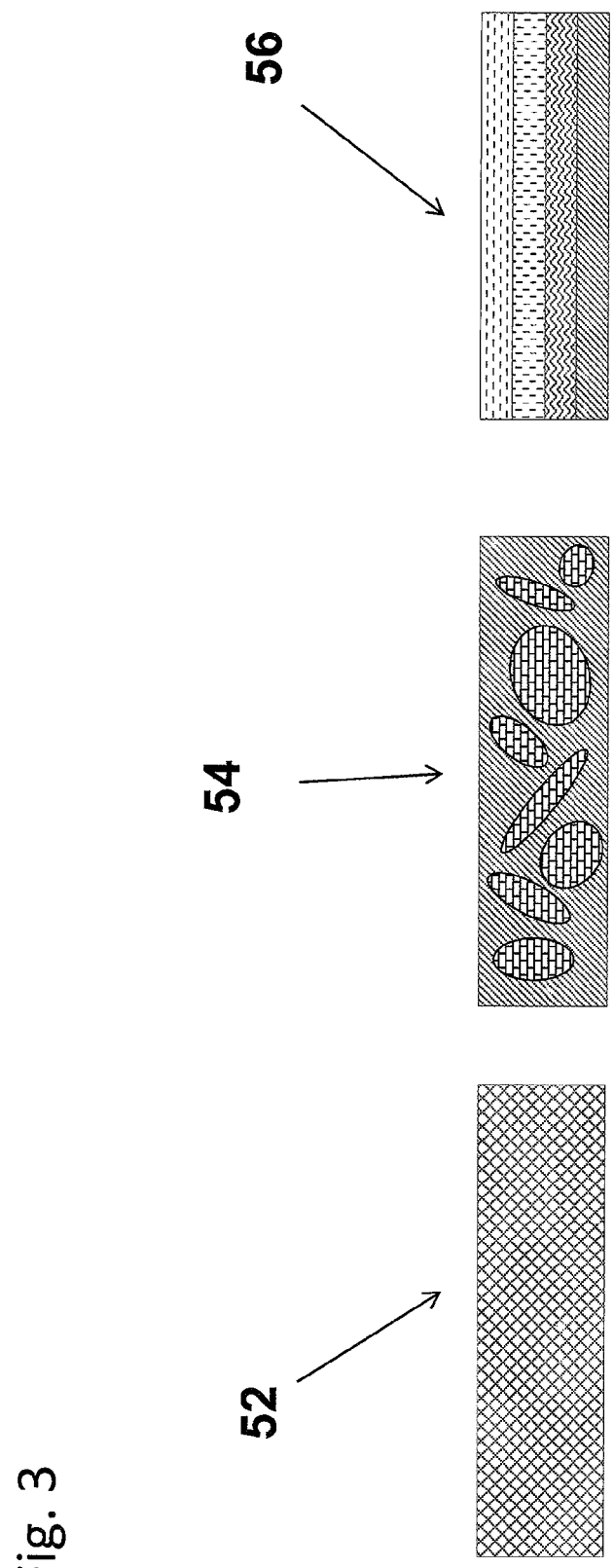
FIG. 3 is a schematic of the structure form of the material composition and structure for the photon-emission layer, the photoelectron emission layer, and the charge carrier generation layer.

The top metallic layer 14 uses the "metallic" materials selected from the material list for the bottom metallic layer (also considering the material work function matching), and as depicted in FIG. 2, a structure of the top metallic layer 14 comprises a metallic material mesh 30 includes at least a thin metallic material film 32 with an array of holes (or apertures) 34 and a distance between the holes, and both the size of the holes and the distance are less than the wavelength of the emitted photons (i.e., light) or pumping photons if optical pumping is used. When a structure size is less than interested photon wavelength, it is called "subwavelength". The subwavelength nature of the features in the metallic material mesh 30 is essential to the desired photonic property. The holes (aperture) 34 can have any shape including a round hole, a polygon, a triangle, holes with random edges or a superposition and combination of one or more thereof. The holes can be periodic and aperiodic. The size and the shape of each hole can be the same or different from other holes, as long as most of them are subwavelength.

The structure of the top metallic layer 14 also can be in form of an array of metallic material disks 40. Each disk 42 is subwavelength and has a shape selected from the group consisting of round hole, polygon, triangle, holes with random edges or a superposition of one or more thereof. The distance between the disks 44 is also subwavelength. The holes can be periodic and aperiodic. The size and the shape of each hole can be the same or different from other holes, as long as most of them are subwavelength. The disks can be periodic and aperiodic. The size and the shape of each disks can be the same or different from other holes, as long as most of them are subwavelength. Optically the metallic material disk array can function similar as that the metallic material mesh (i.e., the hole array) in transmitting the light and in working a mirror for the photonic cavity, but the disk array cannot conducting electric current to be used as an electrode for a device. To overcome the problem, a thin electrical conducting layer, which will not significantly affect the optical property of the photonic cavity can be deposited on the disk array. One example is to deposit ITO on the disk array for visible light range. In some case a ultra-thin metal film can be used with the disk array. The thickness of the top metallic layer 14, whether using in a hole array or a disk array, is from about 1 nm to about 150 nm, with one embodiment having a preferred thickness of about 15 to about 40 nm.

The light-emitting layer 18 is composed of one or more of a single material 52, a mixture of a plurality of materials 54, multiple layers of a plurality of materials 56. Examples include the single material often used for optical pumped LEDs, a mixture of different polymers domains (so call "bulk-heterojunction layer") for polymer LESs, and PN junction of semiconductors.

The materials for the light-emitting layer 18 is the light-emitting material can be a material such as an inorganic and organic light-emitting materials in either in crystal, polycrystalline, amorphous, or hetero-mixture, and combination of one or more thereof. The hetero-mixture means that difference material in small grains are mixed together. Examples of inorganic light-emitting materials include: III-V materials (as GaAs, InP, AlGaAs, GaN, (AlGa)InP), II-VI material (as CdZnSe—CdMgZnSe, ZnSe), nano-scale materials (as quantum dots of cadmium selenide, cadmium sulfide, indium arsenide, and indium phosphide), and combination of one or more thereof.

The examples of organic light-emitting materials include small molecule: dye (as phosphorescent dyes), p-type conjugated molecules (as tetracene and pentacene), n-type conjugated molecules (as fullerene derivatives (as [6,6]-phenyl-C61-butyric acid methyl ester (PCBM), and polymers: poly (1,4-phenylene vinylene) (PPV) (as MEH-PPV, MDMO-PPV, BCHA-PPV), poly(1,4-phenylene) (PPP), polyfluorenes (PFO) (as poly(9,9-dioctylfluorene)), poly (thiophenes) (as regiorandom poly(3-octylthiophene)), nitrogen-containing polymers (as 1,3,4-Oxadiazole), water-soluble LEPs (as sulfonated PPV).

The metallic photonic resonant cavity antenna 12 can, for certain light wavelength range (so-called "working band"), enhance radiation and the extraction of light from the light-emitting material 18 inside of the cavity to the free space outside of the cavity antenna as well enhance the optical pumping light (if needed) to enter the cavity 12 from outside to inside. The enhancements and the center wavelength and the bandwidth of the working depend upon several factors, including the materials and geometry of the light-emitting materials, the top metallic layer, the top interface layer and the bottom interface layer, and the material of the bottom metallic layer. The geometry above means the thickness of these layers and the later size and period of the holes or disks in the top metallic layers. The factors should be optimized to maximize the radiations to the free space in the selected radiation wavelength of the a particular light-emitting layer 18.

For the LED 10, the disclosed embodiment is for the cavity 12 to act as an antenna to radiate the light generated inside the cavity 12 to outside, rather than strong absorption for the light coming from outside of the cavity. Therefore, the cavity 12 for the LED 10 is longer (i.e., thicker) than that for the photoelectron source 60 and the photodetector 100. A typical length of the cavity 12 for polymer light-emitting materials is from about 50 nm to about 300 nm. These parameters are critical for the enhancement and the working band. An improper design (mismatch the device working band with working wavelength) will greatly reduce the enhancement and working band.

Typically, the thickness of the light-emitting layer 18 is in the range of about 20 nm to about 300 nm. The top metallic layer 14 has a period of the hole array of about 50 nm to about 400 nm for the visible light emission, and a thickness between about 10 nm to about 80 nm. The bottom metallic layer thickness between about 50 nm to about 500 nm and average reflectance greater than about 90%.

Examples for the top interface layer 22 include groups of charge carrier transporting/blocking layer as poly(3,4-ethylenedioxythiophene) poly(styrenesulfonate) (PEDOT:PSS), fullerene derivatives (as C60), aluminum tris(8-hydroxyquinoline) (Alq3), lithium fluoride (LiF), calcium (Ca) and titanium oxide (TiOx); groups of optical spacer layer as transition metal oxide of zinc oxide (ZnO), titanium oxide (TiOx) and molybdenum dioxide (MoO2); groups of adhesion layer as titanium (Ti), aluminum (Al), chromium (Cr), platinum (Pt) and polyimide.

Examples for the bottom interface layer 24 include groups of charge carrier transporting/blocking layer as poly(3,4-ethylenedioxythiophene) poly(styrenesulfonate) (PEDOT:PSS), fullerene derivatives (as C60), aluminum tris(8-hydroxyquinoline) (Alq3), lithium fluoride (LiF), calcium (Ca) and titanium oxide (TiOx); groups of optical spacer layer as transition metal oxide of zinc oxide (ZnO), titanium oxide (TiOx) and molybdenum dioxide (MoO2); groups of adhesion layer as titanium (Ti), aluminum (Al), chromium (Cr), platinum (Pt) and polyimide.

These parameters enhance the performance and the working band wherein an improper design will greatly reduce the enhancements and working band.

All materials described in this disclosure can be in crystal, polycrystalline, amorphous, or hetero-mixture. The hetero-mixture means that difference material in small grains are mixed together.

Other specifications and examples for the LED are given in EXAMPLE 1.

(2) Photoelectron Source

Figure 4:
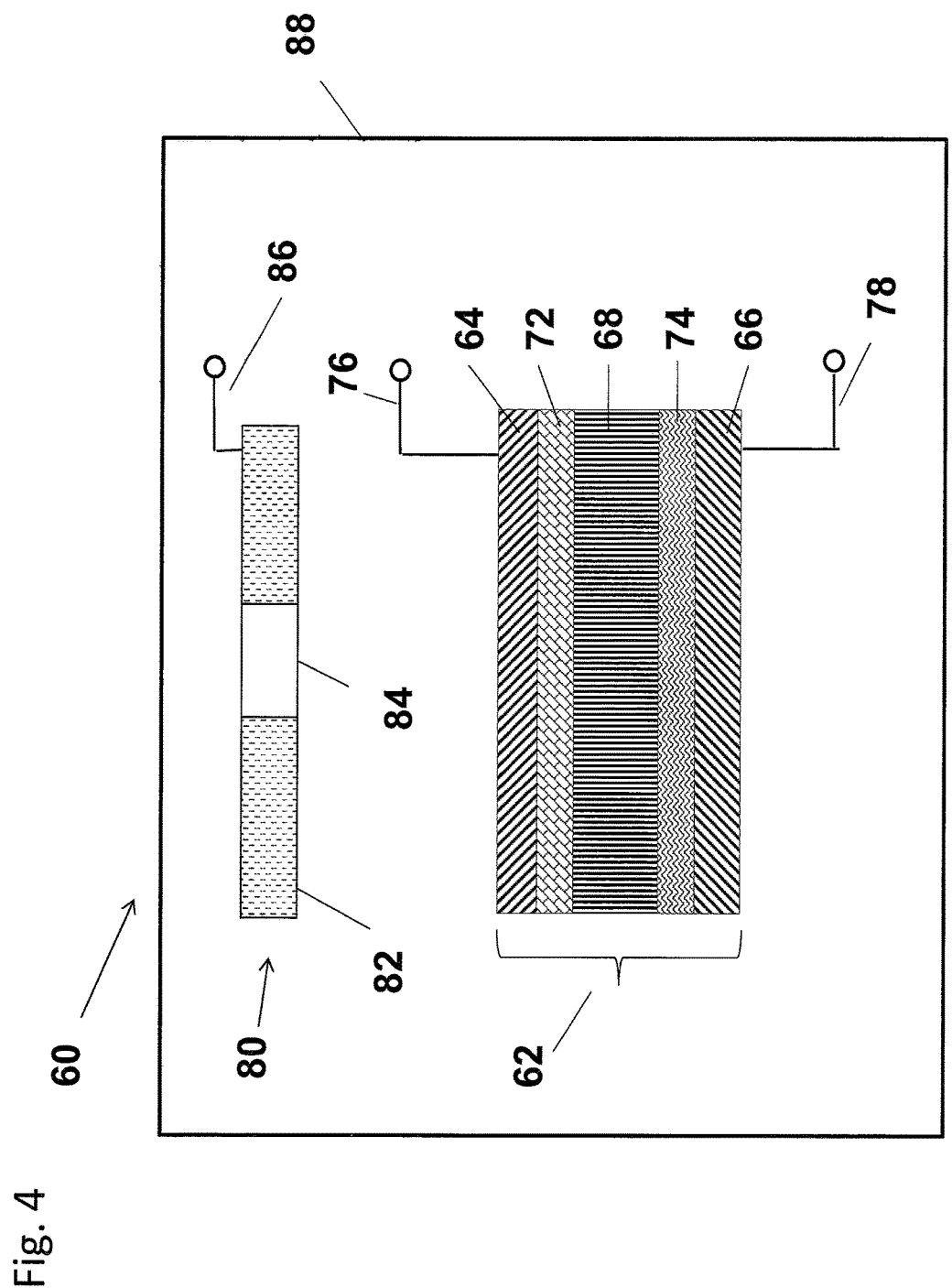
FIG. 4 is a schematic of photoelectron source.

Fundamentally different from the conventional design principle, as shown in FIG. 4, the photoelectron source 60, also termed the "plasmonic-enhanced nanostructured electron-source (PNE)", comprises a metallic photonic resonant cavity 62 which further comprises: a thin top metallic layer 64 that is light transmissive, a bottom metallic layer 66, and a photoelectron-emission layer 68 between the top and bottom metallic layers 64 and 66, and the photoelectron-emission layer 68 includes a photoelectron-emission material that, upon an irradiation of incoming photons, produce electrons (termed "photoelectrons) and the photoelectrons come to the free space outside the photoelectron-emission layer 68. Besides being used as a part the photonic cavity 62, optionally the top metallic layer 64 and the bottom metallic layer 66, each serves as an electrode, by connecting to the electric lead 72 and 74. Using the electrodes an electric field can be applied to the photoelectron-emission layer 68, which helps the extraction of photoelectrons out from the photoelectron-emission layer 68 to the free space.

Optionally, the photoelectron-emission layer 68 may have a top interface layer 72 on its top surface, and a bottom interface layer 74 on its bottom surface. The top and bottom interface layers 72 and 74 are for providing good adhesions between layers (serving as adhesion layer) or electrical isolation.

Also optionally, for helping the escape and conditioning of the photoelectrons, a third electrode 80 is placed in the neighborhood of the top metallic layer 64, and/or a thin material coating on surface of the photoelectron-emission layer 68 in area of openings (e.g., holes) 34 of the top metallic layer 64. An example of the coating is inorganic material as cesium (Cs) and its compounds, or organic material as Phosphorescent dye, and a like. Another option is that the photoelectron source 60 is inside a vacuum chamber 88, which enclosed all other parts photoelectron source 60 of the described above.

The photoelectron source 60 operates in the flowing way. An incoming light of certain wavelength transmits through the top metallic layer 64 and enters the photoelectron-emission layer 68; the incoming light is absorbed by the photoelectron-emission layer 68 and created photoelectrons, and some of the photoelectron will come out of the photoelectron-emission layer 68 to the free space outside, which is caused by either photoelectrons' own energy or extraction electric field or both. The metallic photonic resonant cavity 62, which has a working wavelength range match that of the incoming light, enhances the light transmission and enhance the absorption by trapping light through multiple reflections inside of photoelectron-emission layer 68, and hence enhancing quantum efficiency.

The specifications of the top metallic layer 64 and the bottom metallic layer 66 for the photoelectron source 60 include (or are similar) the specifications of the top metallic layer 14 and the bottom metallic layer 16 for the LED 10. However, the selection of a particular set of the specifications for the photoelectron source 60 mostly is mostly different from that for the LED 10 or the photodetector 100 for several reasons: (1) To form an effective metallic photonic resonant cavity, the top metallic layer and the bottom metallic layer must be designed and adjusted according to (i) the active layer selected for photoelectron source which is drastically different for the LED 10 and the photodetector 100, and (ii) the working light wavelength for the photoelectron source, which also can be very different from the LED 10 and the photodetector 100. (2) The work function of the materials for the top metallic layer 64 and the bottom metallic layer 66 must match that for the photoelectron-emission layer 68, the top interface layer 72 and the bottom interface layer 74. And (3) the key function differences of photoelectron source from the LED and photodetectors requires different designs.

The photoelectron-emission layer 68 further comprises an optional top interface layer, a middle functional layer, and an optional bottom interface layer. In some embodiments, the optional layers are not necessary. The middle functional layer comprises a semiconductor, such as GaAs, GaN, Si, and other semiconductors (organic and inorganic, elements or compounds), which generate electrons upon irradiation of incoming photons. The photogenerated electrons are called photoelectrons. Some of the photoelectrons generated near at the semiconductor surface can escape from the semiconductor and go through the opening in the top metallic layer into free space outside. The semiconductor layer is very thin to reduce the photoelectron pulse width, since electron travel with a finite velocity (about or less than 1E7 cm/s) a thicker semiconductor will have electron generated at different locations that are far apart, which means they will take different (longer) time to escape from the semiconductor surface and hence longer electron pulse width. Furthermore, the carrier lifetime in the semiconductors can be shortened, so that any photoelectrons (also called carriers) will be eliminated by recombination, if they do not come out the semiconductor surface, thus it reduce both pulse width and energy spread for the photoelectron escaped to the free space (so-called "free space photoelelctrons").

The metallic photonic resonant cavity can, with proper designs, can increase the transmission of incoming light from outside to the inside of the cavity and the light trapping inside of the cavity. Both effects can significantly increase the external quantum efficiency (defined as a ratio of the number of photoelectrons to that of the incoming photons). This is particularly important for a thin semiconductor with a thickness less than the light absorption length, where, without a cavity, the most of incoming light will just transmitted through the semiconductor without significant absorption (hence without significant photoelectron generation). The cavity can make the light reflection from the cavity much smaller than a bare semiconductor fabrication.

Various embodiments of the photoelectron source 60 can have one or more of seven (7) elements that a conventional photoelectron sources does not have to overcome the challenges. They are: (1) the middle function layer is an ultra-thin photoelectron emission semiconductor (GaAs) layer (less than or equal to about 100 nm) which is much less than light absorption length, (2) the middle function layer also has ultra-short carrier lifetime (e.g., less than about 0.2 ps), (3) plasmonic subwavelength lens(es) (made of Au) on top of the GaAs to focus and shape the light into a (an array of) hole(s) of subwavelength size and to greatly enhance light transmission to GaAs, (4) a metal backplane under the thin GaAs to reduce image charge effect, enhance cooling and light harvesting, (5) a resonant cavity (formed by the plasmonic lens, the GaAs and the backplane) to absorb the majority of incoming fs laser pulse in the GaAs (greater than about 80%)—hence greatly improving quantum efficiency, (6) an additional voltage applied between the top metal and the back metal backplane to create an additional electrical field inside the GaAs for better electron extraction, and (7) a segmented aperture array to divide incoming light into subwavelength pockets. These innovations, either used individually or together will create the new electron sources with far better performances better than conventional designs as described above. Some basic operational principles, advantages over the prior art, and other specifications are given below.

(1) The ultra-thin the middle function layer (photoelectron-semiconductor).

The ultra-thin the middle function layer (photoelectron-semiconductor) offers, by truncating the semiconductor (e.g., GaAs) thickness far less than light absorption length in bulk semiconductor, a short photoelectron escaping depth, hence a shorter electron pocket length and a smaller longitudinal emittance, as well as better cooling. The semiconductor thickness also needs to be shorter than the distance equal to the required photoelectron pulse width times the photoelectron travel speed in the semiconductor, so that all photoelectron can travel out of the semiconductor within the required photoelectron pulse width. The specific thickness of the photoelectron emission semiconductor is also determined by the requirement of the photonic cavity to be formed by the semiconductor and the top and bottom metallic layers. For example, for GaAs (as the semiconductor for the middle functional layer) excited by 800 nm wavelength photons, the absorption length is about 600 nm and the maximum electron velocity in GaAs is 1E7 cm/s, so for less than 1 ps photoelectron pulse width, the thickness of the GaAs should be less than 100 nm. But to have the photonic cavity to resonant at 800 nm for the incoming light (need to define resonant), the final GaAs thickness is between about 40 nm to about 50 nm.

(2) The ultra-short Photoelectron lifetime in the Semiconductor (the middle function layer).

Even with a thin semiconductor layer, the escaped photoelectrons (need definition) have long tails, namely long pulse width, because not all photoelectrons escape from the semiconductor with the maximum drift velocity and in fact many of them have slower velocity. To overcome this problem to achieve a short pulse width, the invention uses semiconductors with a very short photoelectron lifetime (also termed carrier lifetime), so that all photoelectrons that cannot escaped with a designed time will be eliminated by recombination. For example, in GaAs, we can reduce the carrier lifetime to about 0.2 ps by growing GaAs at a low temperature (about 200 C to about 250 C) to limit the escaped photoelectron pulse width to about 0.5 ps, as we have demonstrated in our experiments. The carrier lifetime in a semiconductor can be controlled by radiation of energetic particles such as ions, alpha-particles, and electrons, or by adding foreign materials into the semiconductors.

(3) The Metallic photonic resonant cavity.

The Metallic photonic resonant cavity, as described herein, can significantly increase the light transmission through the top metallic layer (namely, making the light transmission better than that just the top metallic layer alone without a metallic photonic resonant cavity), and can enhance the light trapping and hence absorption inside of the cavity, as experimentally demonstrated in the examples herewithin. The high light transmission and the absorption by the cavity will greatly increase quantum efficiency and reduce the required pumping light source (e.g., laser or lamp), which in turn, reduce the equipment size and cost for photoelectron generation, leading a much broader applications of such photoelectron source. Less light pumping power also can lengthen the photoelectron source lifetime. Another important point is that the top and bottom layer should be metallic, as defined previously, which not only offer better light transmission and trapping, but also offer wider light wavelength range for such benefits by a single photoelectron source (it is called bandwidth or working bandwidth). For each photoelectron source, in additional to the bandwidth, there is a particular wavelength (frequency) where the benefits are the best (For example, the light transmission and absorption are the highest). Such wavelength or frequency is called resonant wavelength and resonant frequency. The bandwidth and the center resonant frequency of the cavity can be adjusted by changing the thickness and material of the active layer, the material, thickness, and nanostructures' size and shape of the top metallic layer, and the material of the bottom metallic layer. It is possible to make the bandwidth with very broad, for example (Example 2), covering most of the visible light wavelength range, as demonstrated herewithin.

(4) The metallic subwavelength lens (also referred to as lenses) by the top metallic layer.

The aperture (or holes) in the top metallic layer limit the escape (i.e., extraction) of the photoelectrons from the active layer (i.e., the semiconductor) from the aperture only, not from the area which are covered with metals. Therefore, the location and area for photoelectron extraction in the new photon source, xxx, are fixed and unlike the conventional photoelectron source, which is determined by the irradiating light. This means that the new photoelectron source 60, can have an photoelectron extraction with a size much smaller than light diffraction limit, namely subwavelength, and immune the light source jitter (need more explanation). For example, about 50 nm holes. Plasmonic (e.g., metallic) lens(es) will be used to focus and shape the light into a (an array of) hole(s) of subwavelength size and to greatly enhance light transmission to the PEM. The materials used for the plasmonic lenses can be metals (gold, silver, copper, aluminum, etc.), alloys, or semiconductors with high conductivity. The shapes can be a mesh with holes or rectangles, or anther other structures that can focus the light into the PEM.

(5) The bottom metallic layer.

The bottom metallic layer can not only provide a mirror for the photonic cavity, but also significantly reduce the image charge effect and provide much better cooling.

(6) The extracting-field inside the active layer.

Optionally, a voltage can be applied between the top metallic layer and the bottom metallic layer to create an additional electrical field inside the active layer for better extraction of photoelectrons outside of the active layer. The voltage will be determined by the needed electric field which varies from 0.1 V/cm to 100M (Mega) V/cm.

(7) The segmented aperture-array.

The segmented aperture-array of the photoelectron source divides incoming light into pockets. The pocket size will vary from 10 nm to 100 microns. The pocket number varies from one to one billions.

Specification of Light Source for Generating Photoelectrons. The light source for generating photoelectrons can be narrow wavelength bandwidth (e.g., lasers) or broad bandwidth (e.g., lamp) or between the two (LEDs), pulsed or continuums, of different power density. The wavelength range can be from about 10 nm to about 30 microns. For GaAs PEM, the wavelength is from about 0.5 microns to about 1.5 microns.

The surface of the photoelectron emission materials can be coated with a thin layer of other materials to further assist the photo-electron generation. The coated thin layer material can be cesium (Cs) and its compounds.

Deep-Sub-Diffraction-Limit Laser Beam Spot. Our experiment and simulation (such as above) have clearly demonstrated that a plasmonic lens with single nanoscale hole can focus the light into the hole with high transmission to make light beam with much smaller spot size and higher intensity. The light spot size can be much smaller than the conventional diffraction limit, for an example below about 50 nm—nearly an order of magnitude smaller. Therefore the PNE can achieve much smaller electronic packet-size and much smaller transverse emittance if the space charge is not the limit.

In one embodiment, we will initially start with a diameter hole with about 100 nm diameters, which is already smaller than the diffraction limited light spot (focused by a conventional lens) by about 10× smaller in diameter and about 100× smaller in the area. Then we will reduce the hole down to 20 nm diameter—50× in diameter and 2,500× in area smaller than diffraction limit. We will explore the minimum light (hence electron packet) spot size allowed by the maximum charge density.

Reduction of Image Charge Effects. The image charge effect is a limiting factor to the emittance of a device. In the proposed PNE design, we will use a thin photoelectron emission material, a plasmonic lens plane on top and a metal back plane underneath, with a bias between the planes to create an additional electric field inside GaAs to greatly reduce the image charge effects. Using Poison simulation to calculate the electric field in GaAs for a conventional electron source and the PNE, we found that the PNE without a bias has about 10× less the image charge effect, and about 70× less when the bias is about 1V (See FIG. 9). In the simulation, the thickness of GaAs is about 150 nm, and the total amount of charge is about 1 pc.

Small Emittance (Transverse and Longitudinal) The emittance of electron source is defined as the product of root mean square (rms) of the beam pocket volume times the rms of the volume in the momentum space (hence a volume in the position-momentum 6D space). The total emittance can be further divided into transverse and longitudinal emittances. For an ellipsoid or cylindrical shaped laser pulse, the transverse emittance can be further reduced to 1D space times 1D momentum. A smaller emittance means a smaller total electron beam size. Most previous studies have been focused on the reduction of transverse emittance (little on longitudinal emittance), although it has been suggested that a small transverse emittance can be achieved through a smaller longitudinal emittance and the exchange of longitudinal and transverse emittance.

Laser Excitation. A variety of laser sources can be used to excite photoelectrons with different wavelength from about 10 nm to about 3,000 nm, and different pulse duration from about 0.01 ps to about 100 ns. We have used our existing Ti-sapphire fs laser system (Mira-900, Coherent Inc.) as the excitation source. Our Mira-900 can generate a pulse of less than about 0.2 ps (about 10 nJ per pulse—more than sufficient to generate 1 pC charge/pulse for a QE greater than 10%) with a repetition rate of about 76 MHz at a tunable wavelength (720 nm to 810 nm). This Ti-Sapphire laser will be used to characterize the proposed cathode in the proof-of-principle stage. Later we will switch to pulsed fiber lasers, since they have a portable size and can be coupled to the system without using bulky free space optical elements, suited for integrated system. We plan to use a fs 780 nm fiber laser (commercial: M-fiber A 780, Menlo Systems Inc.) with a 0.1 ps pulse width, repetition rate of 100 MHz, and an average power greater than about 180 mW (about 2 nJ per pulse). Later we will use 515 nm fs fiber laser (commercial: A-515, Menlo Systems Inc.) as the excitation source, and this fiber laser system can generate about 0.15 ps pulses (about 2.5 nJ per pulse) at a repetition rate of about 100 MHz.

Wafer-scale Fabrication of PNE. We will fabricate the new electron source, PNE, in the wafer scale with multi-chips per wafer. It starts with MEB grown of LT-GaAs, wafer bonding, thin-film liftoff, metal deposition, nanoimprint lithography, etching and deposition of oxide, to form these nanopatterns. The fabricating these devices will use nanoimprint, Air Cushion Press bonding.

The fabrication starts by epitaxially growing a thin layer aluminum gallium arsenide (AlGaAs) followed by a thin low-temperature GaAs (photoelectron emission layer) using MBE, which will be either in-house MBE or commercial vendors. After the MBE growth, we will deposit Au on GaAs with a thin adhesion layer and then bond the wafer into a metal (e.g., copper or molybdenum) cooling block. Then we will use selective etching to remove AlGaAs in an etchant that will not etch gallium arsenide and hence separating the top thin layer of GaAs from the GaAs substrates. Then we will pattern the top surface to define the plasmonic lens(es) by using nanoimprint and a Au lift-off. The imprint pattern has a very small feature size (array of holes (having diameters of between about 20 nm to about 75 nm) of about 200 nm pitch). To build integrated gun, we can fabricate the anode on chip by deposition of thick SiO2, opening the window, and pattern Au anode.

(3) Photodetectors

Figure 5:
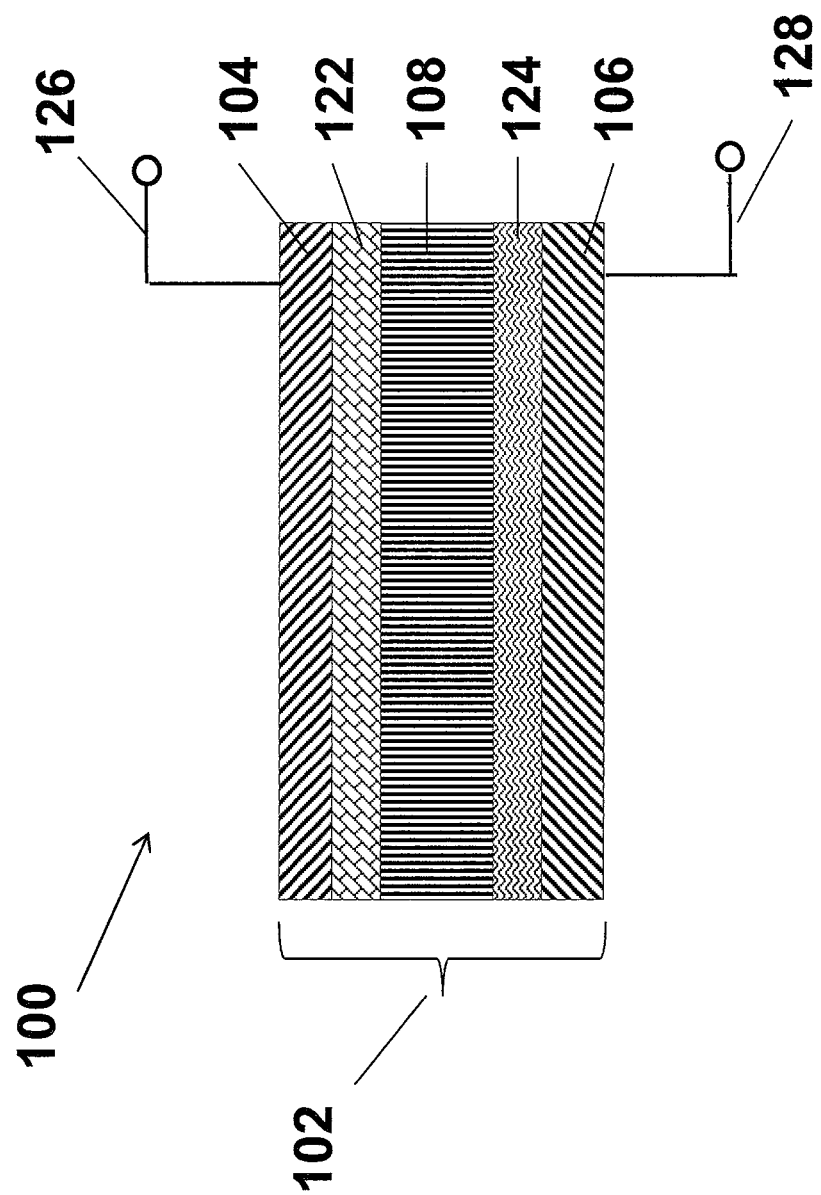
FIG. 5 is a schematic of a photodetector.

As shown in FIG. 5, the photodetector 100 in the invention, also termed "plasmonic cavity with subwavelength hole-array (PlaCSH) solar cell", comprises a metallic photonic resonant cavity 102 comprising: a thin top metallic layer 104 that is light transmissive, a bottom metallic layer 106, and a thin photodetection layer 108 positioned between the top and bottom layers, and the photodetection layer 108 generates electrical charge carriers under an irradiation of incoming light (photons). Besides being used as a part the photonic cavity 102, the top metallic layer 104 and the bottom metallic layer 106, each serves as an electrode to the photodetector 100, by connecting to electric lead 126 and 128. The electrodes will supply the electrical charge carriers (electrons or holes) from the photodetector 100 to outside, providing electrical signal and power. Clearly, the top metallic layer 104 also serves as a light transmissive electrode that transmits the incoming light from outside to inside of the cavity.

Optionally, the photodetection layer 108 may have a top interface layer 122 on its top surface, and a bottom interface layer 124 on its bottom surface. The top and bottom interface layers 122 and 124 are for providing good adhesions between layers (serving as adhesion layer), blocking a particular electrical charge carrier type (serving as charge carrier blocking layer), or enhancing the performance of the cavity antenna (serving as a spacer). The spacer might be needed in a metallic photonic cavity to reduce certain quenching of light by metal.

The photodetector 100 operates in the flowing way. An incoming light of certain wavelength transmits through the top metallic layer 104 and enters the photodetection layer 108, and the light is absorbed by the photodetection layer 108 to create electric charge carriers. In some arrangement, the photodetection layer 108 can separate the carrier by their charge types. The metallic photonic resonant cavity 102, which has a working wavelength range match that of the incoming light, enhances the light transmission and enhance the absorption by trapping light through multiple reflections inside of the photodetection layer 108. The enhancements of transmission and the absorption mean that for a given light-emitting material (and the same geometry), the photodetector with the metallic photonic resonant cavity 102 have more light transmission into the cavity 102 and more light absorption in the photodetection layer 108 than the photodetector without the cavity. As shown, by the EXAMPLE 3, such cavity can absorb over 90% of the total incoming light. Furthermore the cavity can greatly enhance the quantum efficiency and power efficiency of the photodetector, even the photodetection layer 108 has a thickness that is a fraction of the light absorption length in the material. Under the incoming light, the photodetection layer 108 generates electric charge carriers and separates them according to the charge carrier type to have one carrier type for each electrode of 126 and 128, through the top metallic layer 104 and the bottom metallic layer 106, respectively.

The specifications of the top metallic layer 104 and the bottom metallic layer 106 for the photodetector 100 include (or are similar) the specifications of the top metallic layer 14 and the bottom metallic layer 16 for the LED 10. However, the selection of a particular set of the specifications for the photodetector 100 mostly is mostly different from that for the LED 10 or the for several reasons: (1) To form an effective metallic photonic resonant cavity, the top metallic layer and the bottom metallic layer must be designed and adjusted according to (i) the active layer selected which are drastically different for the photodetector and for the photoelectron source and (ii) the working light wavelength, which also can be very different between the photodetector and photoelectron sources. (2) The work function of the materials for the top metallic layer 104 and the bottom metallic layer 106 must match that for the photodetection layer 108, the top interface layer 122 and the bottom interface layer 124. And (3) the key function differences between the photodetectors and the photoelectron source requires different designs.

The metallic photonic resonant cavity antenna 102, which can be designed to have a working wavelength range match that of the incoming light, enhances the light transmission and enhance the absorption by trapping light through multiple reflections inside of the photodetection layer 108. The enhancements and the center wavelength and the bandwidth of the working depend upon several factors, including the materials and geometry of the photodetection layer 108, the top metallic layer 104, the top interface layer 122 and the bottom interface layer 124, and the material of the bottom metallic layer 106. The geometry above means the thickness of these layers and the later size and period of the holes or disks in the top metallic layers. Different from the LED 10 and the photoelectron source 60, the factors should be optimized to maximize the cavity effects on enhancing the light transmission though the top metallic layer 104 and enhancing the light absorption by trapping light through multiple reflections inside of the photodetection layer 108. The optimization for photodetector 100 is for creating most electrical signals (electric charge carriers) in the electrodes for a given light irradiation, while the LED 10 is for radiating most of light generated inside of the photonic cavity 102 to the free space outside. Therefore the length (i.e., thickness) of the photonic cavity 102 is much shorter than that for the LED 10—sometime, it is nearly half of the length. A typical length (i.e., thickness) of the photonic cavity 102 using polymer photodetection material is from about 40 nm to about 130 nm.

The structure of photodetection layer 108 can be selected from the group of one or more of a single material 52, a mixture of a plurality of materials 54, multiple layers of a plurality of photodetection materials 56. Examples include the single material of semiconductors, a mixture of different polymers domains (so call "bulk-heterojunction layer") for polymer LESs, and PN junction of semiconductors.

The materials for the photodetection layer 108 is a photodetection material selected from the group comprising of inorganic material including silicon (as crystalline, amorphous, poly-crystalline silicon), III-V materials (as GaAs, InP, AlGaAs), II-VI material (as copper-indium:diselenide (CIS) and copper-indium:gallium-diselenide (CIGS)), dye-sensitized solar cell materials (as TiOx), nanoscale materials (as quantum dots of cadmium selenide, cadmium sulfide, indium arsenide, and indium phosphide); and organic material including small molecule: dye (as photosensitive ruthenium-polypyridine dye), p-type conjugated molecules (as tetracene and pentacene), n-type conjugated molecules (as fullerene derivatives (as [6,6]-phenyl-C61-butyric acid methyl ester (PCBM))), and polymers: poly(1,4-phenylene vinylene) (PPV) (as MEH-PPV, MDMO-PPV, BCHA-PPV), poly(1,4-phenylene) (PPP), polyfluorenes (PFO) (as poly(9, 9-dioctylfluorene)), poly(thiophenes) (as regiorandom poly (3-octylthiophene)), nitrogen-containing polymers (as 1,3, 4-Oxadiazole), water-soluble LEPs (as sulfonated PPV).

Typically, the thickness of the photodetection layer 108 is in the range of about 20 to about 200 nm. The top metallic layer with regular or quazi-regular hole arrays of period about 50 nm to about 500 nm and thickness of about 10 nm to about 50 nm. The bottom metallic layer thickness 50 nm to 500 nm and average reflectance of greater than about 90%. These parameters are critical for the enhancement and the working band. An improper design (mismatch the device working band with working wavelength) will greatly reduce the enhancement and working band.

Examples for the top interface layer 122 include groups of charge carrier transporting/blocking layer as poly(3,4-ethylenedioxythiophene) poly(styrenesulfonate) (PEDOT:PSS), fullerene derivatives (as C60), aluminum tris(8-hydroxyquinoline) (Alq3), lithium fluoride (LiF), and titanium oxide (TiOx); groups of optical spacer layer as transition metal oxide of zinc oxide (ZnO), titanium oxide (TiOx) and molybdenum dioxide (MoO2); groups of adhesion layer as titanium (Ti), aluminum (Al), chromium (Cr), platinum (Pt) and polyimide.

Examples for the bottom interface layer 124 include groups of charge carrier transporting/blocking layer as poly (3,4-ethylenedioxythiophene) poly(styrenesulfonate) (PEDOT:PSS), fullerene derivatives (as C60), aluminum tris(8-hydroxyquinoline) (Alq3), lithium fluoride (LiF), and titanium oxide (TiOx); groups of optical spacer layer as transition metal oxide of zinc oxide (ZnO), titanium oxide (TiOx) and molybdenum dioxide (MoO2); groups of adhesion layer as titanium (Ti), aluminum (Al), chromium (Cr), platinum (Pt) and polyimide.

(4) Metal MESH for Transparent Conducting Electrode

A light transmissive electrical conducting metallic layer comprises a thin continuous metallic layer with holes and a separation that are less than the wavelength of the transmitted light. The metallic layer is used as a light transmissive electrode to allow light transmission while supplying either electric voltage or current. The hole comprises any shape including round, polygon, triangle, etc. and superposition of them, periodic and aperiodic. The most of the holes and the distance are less the wavelength of light.

Substrate. The devices in the various embodiments described herein will be either supported by a substrate or stand on their own. The substrate can be selected from one or more in the group of thin flexible film or thick and relative rigid substrate and from one or more in the material groups of polymer, amorphous, crystal, polycrystalline, and granular materials.

Fabrication methods for making all the devices described in this disclosure include at least one or more of the following. The deposition of materials is by MBE (both regular and temperature molecule beam epitaxy), evaporation (thermal or electron beam), sputtering, CVD, atomic layer deposition, spinning, and casting. The patterning of nanostructures is by nanoimprint, electron beam and ion beam lithography, optical lithography, self-assembly, as well as lift-off and etching. The nanoimprint can use the form of the plate to plate, the plate to roll, or the roll-to-roll. The fabrication will also involve bonding of the part of the device with other part of the device and bonding of the device to a substrate.

Figure 6:
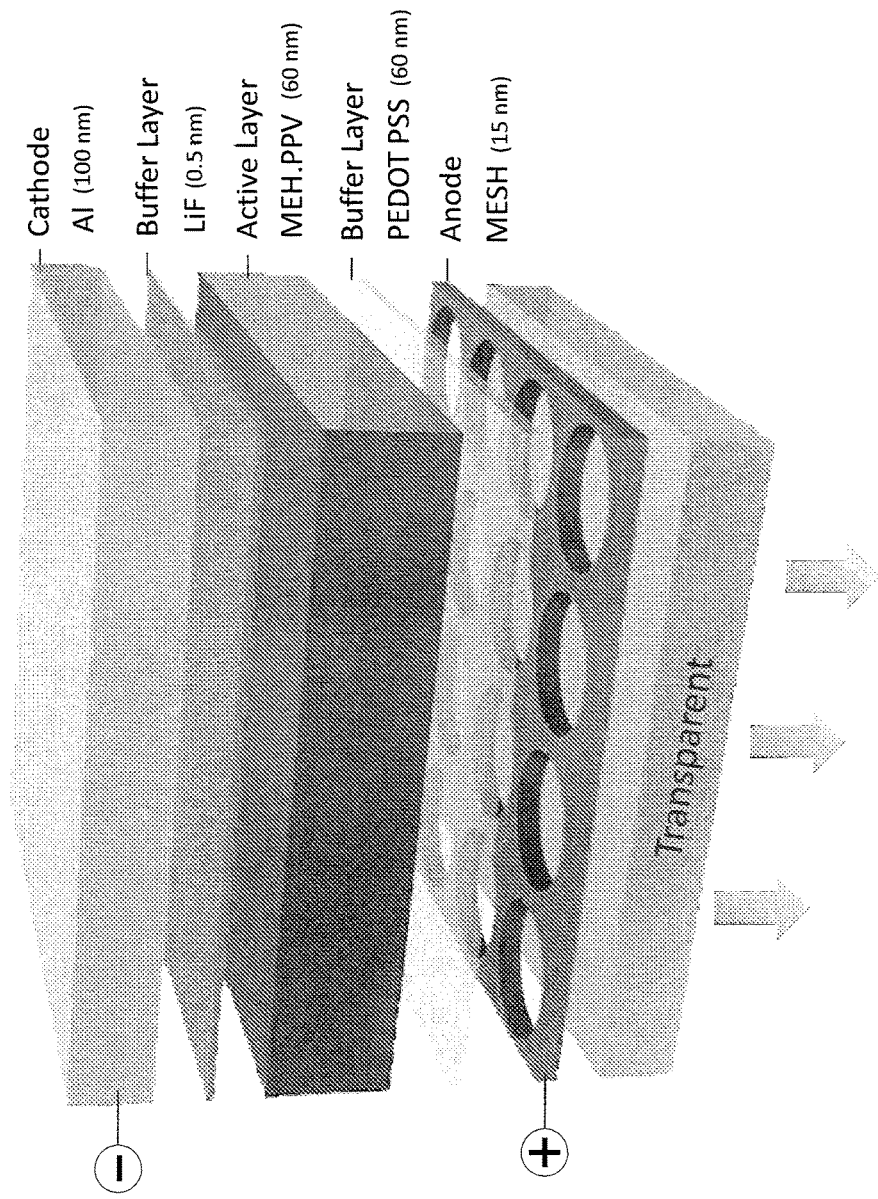
FIG. 6 is a schematic of Plasmonic Cavity with Subwavelength Hole-array (PlaCSH) Light Emitting Diode (LED). PlaCSH-LED consists of Au metallic electrode with subwavelength hole-array (MESH) and a Al backplane, sandwiches MEH-PPV, PEDOT:PSS and LiF layers between the two electrodes.

Example 1. Ultrathin and High-Light Extraction Organic Light Emitting Diode Using Metallic Photonic Resonant Cavity Antenna with Subwavelength Hole Array We have implemented and demonstrated the LED invention in a new organic solar cell, which is termed "plasmonic cavity with subwavelength hole-array (PlaCSH) organic light emitting diode (OLED)". The PlaCSH comprises a top metallic layer of subwavelength nanostructures that at least partially transmits light (in this case is an Au MESH as a transparent front electrode), a metallic Al back electrode, and in between a thin light emitting layer (in this case, contains an electron transport polymer MEH-PPV and hole transport polystyrenesulfonic acid layer PEDOT:PSS). (Detailed device structure in FIG. 6 and the energy band structure FIG. 7). The PlaCSH-LED that has nearly doubled brightness and EQE compared to the identical LEDs except the metallic subwavelength hole array layer is replaced by a thin ITO layer (163% and 193% respectively to be exact). The enhancement is attributed to better radiation and better light extraction by the PlaCSH. The PlaCSH were fabricated by large-area nanoimprint on 4" wafer and hence is scalable to wallpaper size and for low-cost applications.

PlaCSH-LED Structure and Operation Principle. The PlaCSH comprises a top metallic layer of subwavelength nanostructures that at least partially transmits light (in this case is an Au MESH as a transparent front electrode), a metallic Al back electrode, and in between a thin light emitting layer (in this case, contains an electron transport polymer Poly[2-methoxy-5-(2-ethylhexyloxy)-1,4-phenylenevinylene] (MEH-PPV) and hole transport polystyrenesulfonic acid layer PEDOT:PSS).

When the electron and hole pairs recombine in the light emitting layer (at the surface of PEDOT:PSS and MEH-PPV), photons (light) will be generated. Light can be coupled into the optical mode of the cavity and finally go out from the transparent MESH side. There are at least three possible mechanisms for enhancing the light emitted from the device:

Subwavelength photon crystals (PhC) structures on the surface of light emitting layer induced by the MESH partially addresses the problem of total internal reflection and enhances the light extraction efficiency from the active layer. MESH/active layer/Al forms an optical (Plasmonic) cavity which can amplify the light with wavelength matches the cavity resonance. Metallic photonic crystal (MESH) induces surface plasmons for enhancing the fluorescence efficiency of the active material, so enhance the internal quantum efficiency of the LED device.

A PlaCSH LED with an optimized structure has a 15 nm thick gold MESH with a hole array of 180 nm diameter and 200 nm period (as transparent electrode) on a fused silica substrate, 40 nm thick poly(3,4-ethylenedioxylenethiophene):polystyrene sulfonic-acid (PEDOT:PSS) layer (hole transport and electron blocking layer), 60 nm P3HT/PCBM film (electron transport layer), 0.3 nm thick LiF and 100 nm thick Al film (back electrode). Excluding the thickness of the Al electrode and the substrate, the total thickness of the device is 115 nm.

Figure 8:
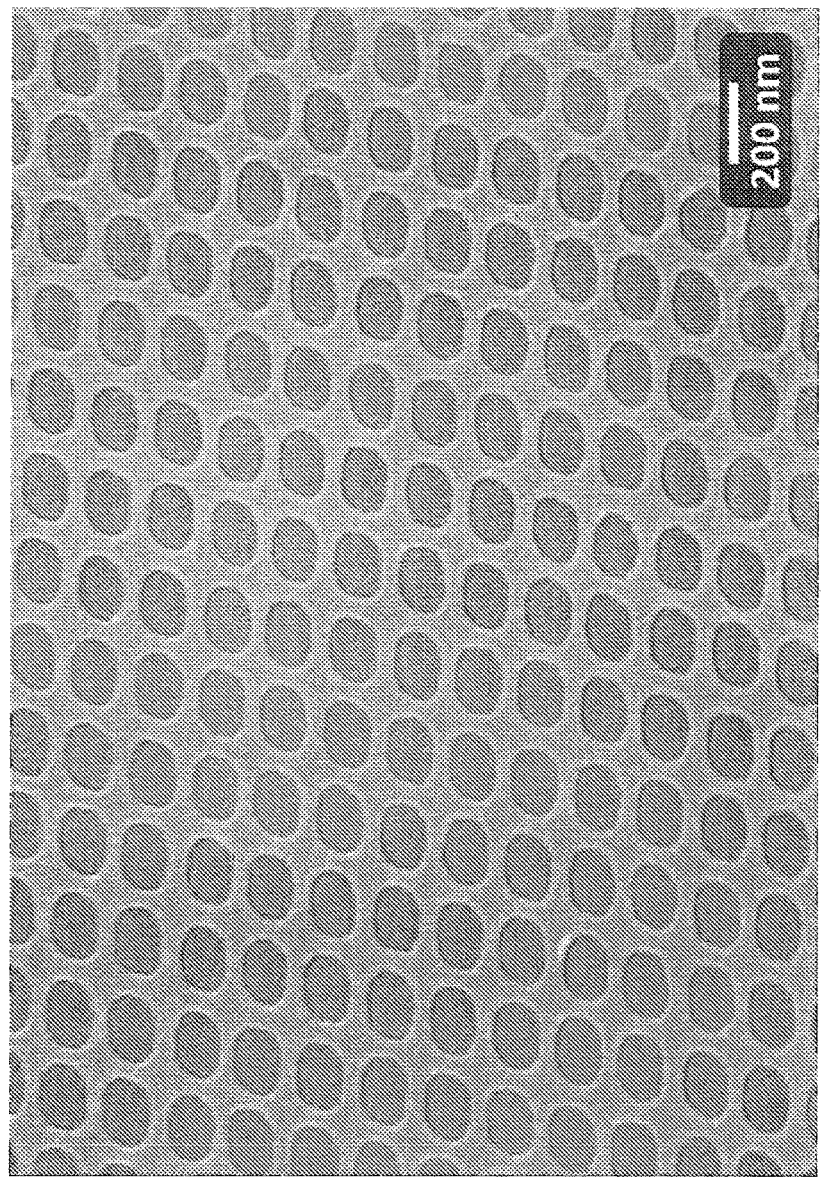
FIG. 8 is a cross-sectional scanning electron micrograph of the MESH for PlaCSH-LED with 175 nm hole size and 200 nm period.

PlaCSH-LED Fabrication. MESH was fabricated by nanoimprint lithography using a 4" mold with sub-wavelength pitch and diameter holes over entire mold area and deposition and lift-off of Au. The mold was a daughter mold duplicated by nanoimprint from a master mold which was fabricated by interference lithography and multiple nanoimprints. Then the 4" MESH wafers were cut into 1 in.×1 in. squares;

Au MESH substrate was cleaned in an ultrasonic bath with methanol, acetone, and isopropyl alcohol for 15 min, and dried in a dry nitrogen stream, followed by 15 min UV ozone cleaning. The treatment also made the MESH hydrophilic. Scanning electron microscopy (SEM) of fabricated MESH shows that the shape of the hole is close to square with round corners and smooth edges, and that the MESH is uniform over large area (FIG. 8).

After that, as a hole transport layer, filtered (0.45 um) poly(3,4-ethylenedioxylenethiophene)-polystylene sulfonic acid (PEDOT:PSS, Sigma Aldrich) was spin-cast at 1000 rpm with thickness about 50 nm (nearly 40 nm above the MESH) from aqueous solution and then dried at 120 degrees for 30 min inside a N2 purged box.

MEH-PPV was purchased from Sigma Aldrich. The active layer containing filtered (5.0 μm) 7 mg/mL MEH-PPV in Chlorobenzene was spin-cast at 1000 rpm with thickness around 60 nm on top of the PEDOT:PSS conductive layer. Annealing in Room temperature in ultra-high vacuum (106 Pa) for 12 hours.

0.3 nm LiF and 100 nm Al were deposited onto the samples with E-beam Evaporation in ultra-high vacuum (106 Pa) through a shadow mask to define top electrodes followed by a post annealing at 70 degrees for 30 min inside a N2 purged box. The device active area, defined by the mask, is around 9 mm$^2$.

For comparison, also fabricated were the reference LEDs, "ITO-LED", which have the exact same device structure/materials/geometry as the PlaCSH-LEDs except that the MESH is replaced by a 100 nm thick ITO. Since ITO has a plasmon wavelength of about 1.2 μm, ITO-SC does not have a plasmonic cavity in the wavelength range of current study. The ITO was deposited on a fused silica substrate and was annealed at 450° C. for 1 h, and after that the ITO-LEDs were fabricated together with PlaCSH-LEDs in the same batch.

Advanced Electrical and Optical Properties of MESH over ITO. MESH is the key component to form a PlaCSH-LED structure. Both the electrical (as sheet-resistance) and optical property (as transmittance) need to be considered. We measured the sheet-resistance as well as the spectra transmittance of (a) 15 nm thick Au MESH's with 200 nm hole pitch and different hole diameters (180, 125, and 75 nm) on glass, with the annealed 100 nm thickness ITO on glass, and (b) Au MESH's with 200 nm hole pitch and 180 nm hole diameter with 4 thickness of 15 nm, 25 nm, 37 nm and 48 nm. In the transmittance measurements, the incident light enters from the MESH to have identical situation as the LEDs.

MESH has good electrical properties. The sheet-resistance measurements show that (a) the 100 nm thick annealed ITO film has 10 ohm/sq sheet-resistance, among the best reported, indicating good ITO quality; (b) the MESH's have sheet-resistances much smaller than the ITO film: even the worst sheet-resistance (180 nm diameter holes) is still 4.2 ohm/sq—2.5 fold better than ITO; and (c) the smaller the hole diameter is, the smaller sheet resistance of MESH, but a lower light transmittance. (d) the thicker the MESH, the smaller sheet resistance of MESH (and proportional to 1/t), but a lower light transmittance. A smaller sheet resistance can improve the electrical efficiency of the LED, hence is highly desirable.

MESH also has good optical performance. The transmittance measurements show that (1) With optimized parameters (15 nm thick MESH's with 200 nm hole pitch and 180 nm hole diameter), MESH has high average transmittance of 78% over entire visible range, which is same as the best performance ITO (80%). (2) Considering the conductance and transmittance product, the MESH (0.78/4.21=0.18) doubles the performance of ITO (0.80/10=0.08). All these indicate that MESH will be a good replacement of traditional conductive oxide as ITO.

PlaCSH-LED's Carrier Transport Principle and Lower Threshold Voltage. As show in the energy band diagram of the PlaCSH-LED device (FIG. 7), the electron from the Al cathode and the holes from the Au MESH are injected into the light-emitting layer, and they recombine and release the energy in the form of a photon through a radiative recombination process. MEH-PPV is the light emitting polymer, which simultaneously serves as the electron transport layer (ETL). PEDOT:PSS layer serves as a hole transport layer (HTL) and electron blocking layer, which is known to improve the hole injection efficiency dramatically. However, there is an electron injection barrier about 1.5 eV in the cathode side. 0.3 nm LiF will decrease this barrier by doping Li into the MEH-PPV layer leading to enhanced electron injection efficiency.

Figure 7:
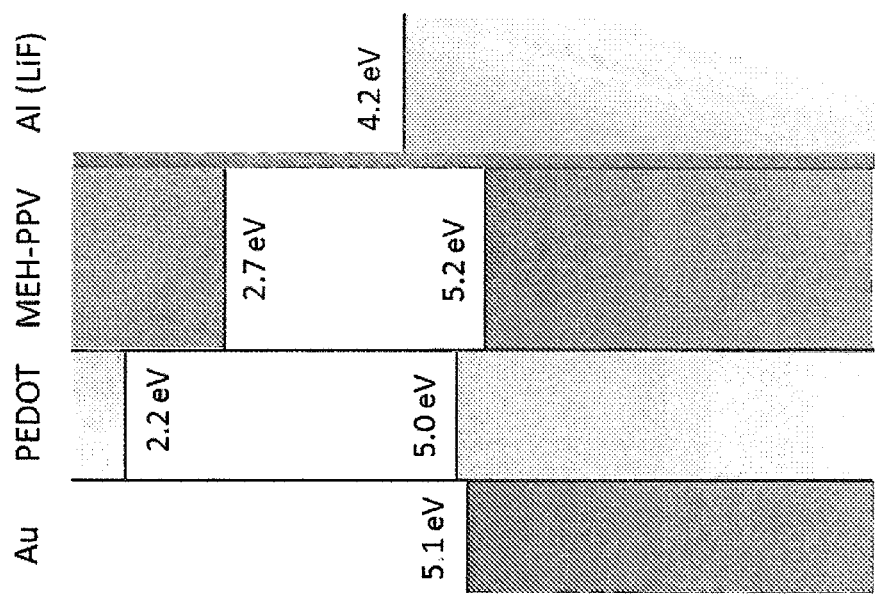
FIG. 7 is an energy band diagram of PlaCSH-LED.

The typical measured current density vs. voltage (J-V) curves of the PlaCSH-LEDs with three kinds of MESHs (same period of 200 nm and three hole size with 75 nm, 125 nm and 180 nm) and ITO-LEDs shows that PlaCSH-LEDs have smaller threshold voltage of 2.5 V for 75H-MESH, 2.4 V for 125H-MESH, 3.0 V for 180H-MESH compared with 3.4 V for ITO (at 10 mA/cm$^2$). It is due to smaller hole injection barrier when Au MESH is used, considering the work function of Au MESH (5.1 eV) matches well with the HOMO of PEDOT:PSS (5.0 eV) compared with ITO (4.6 eV). (FIG. 7)

Figure 9:
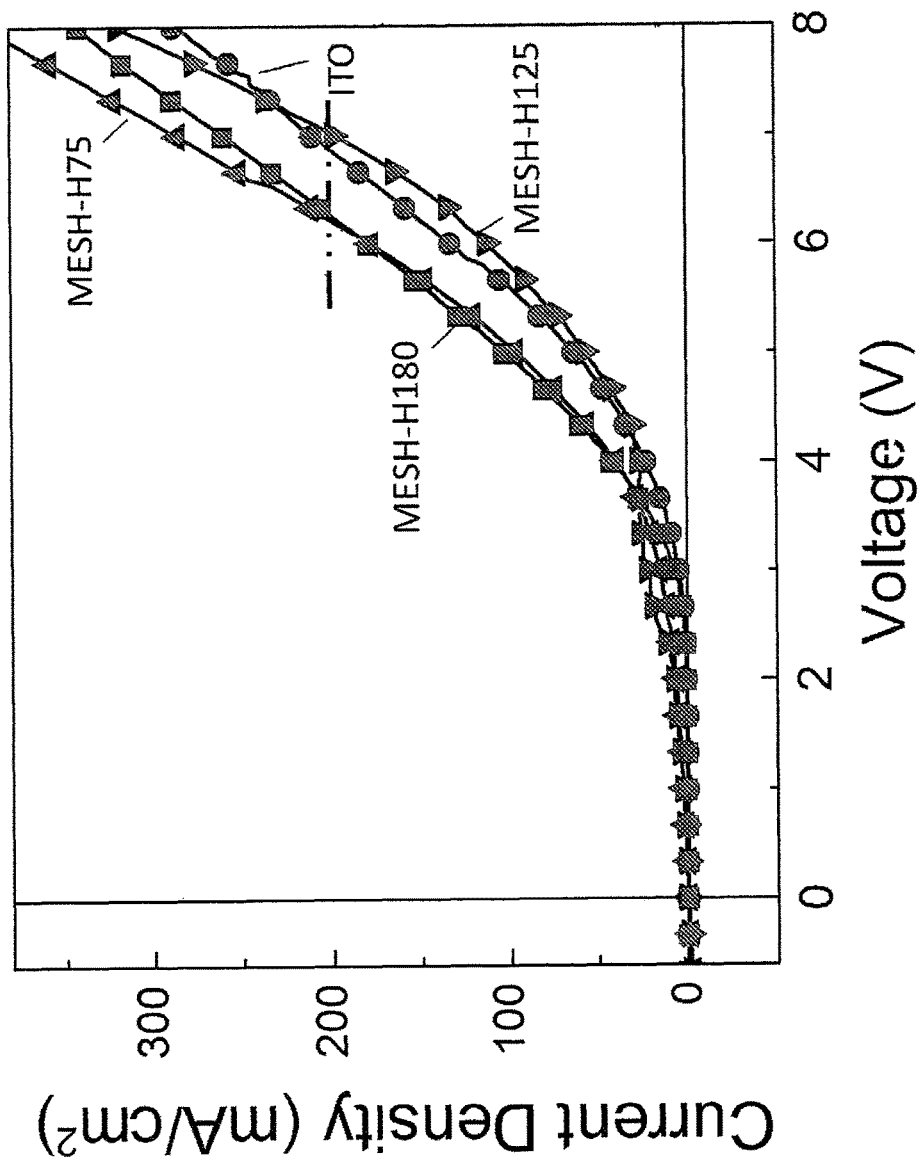
FIG. 9 is a chart illustrating a typical measured current density vs. voltage (J-V) curves of the PlaCSH-LEDs with three kinds of MESHs (same period of 200 nm with three hole sizes of 75 nm, 125 nm and 180 nm) and ITO-LEDs shows that PlaCSH-LEDs have smaller threshold voltage of 2.5 V for 75H-MESH, 2.4 V for 125H-MESH, 3.0 V for 180H-MESH compared with 3.4 V for ITO (at 10 mA/cm$^2$).
Figure 10:
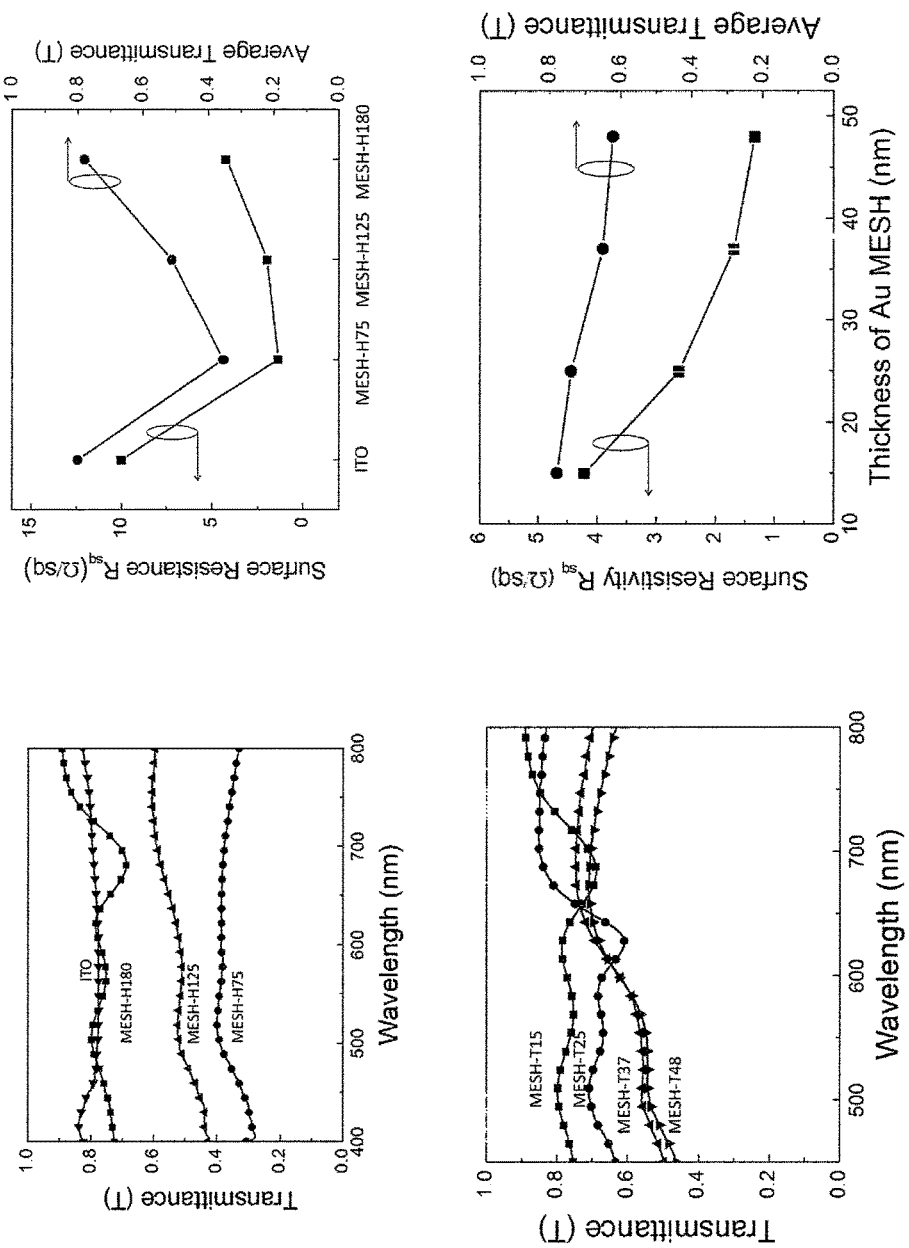
FIG. 10 are four charts illustrating electrical and optical properties of MESH with ITO. Measured the sheet-resistance as well as the spectra transmittance of (a) 15 nm thick Au MESH's with 200 nm hole pitch and different hole diameters (180, 125, and 75 nm) on glass, with the annealed 100 nm thickness ITO on glass, and (b) Au MESH's with 200 nm hole pitch and 180 nm hole diameter with 4 thickness of 15 nm, 25 nm, 37 nm and 48 nm.

63% normal direction brightness enhancement of PlaCSH-LED. The normal direction brightness of both PlaCSH-LEDs and ITO-LEDs were measured using a spectrometer and a calibrated photodetector with 5 mm diameter aperture located 40 mm from the devices, which only collects the normal direction light within ±5o. Under same current density of 200 mA/cm$^2$, PlaCSH-LED with 180H-MESH has normal direction brightness of 10200 cd/m$^2$, which is 63% higher than ITO-LED (6270 cd/m$^2$) as shown in FIG. 9. With current density from 100 mA/cm$^2$ to 300 mA/cm$^2$, PlaCSH-LED has a uniform brightness current efficiency of 5.11 cd/A, which is also 63% higher than ITO-LED (3.14 cd/A) as shown in FIG. 9.

There are three possible reasons for this enhancement. First, for glass/ITO substrates and typical index of refraction organic layers as 1.9 (for MEH-PPV), the calculated external coupling efficiency is only 15% with total internal reflection. Most internally generated light is thus trapped in the active layer. Subwavelength photon crystals (PhC) structure with 200 nm period on the surface of PEDOT-PSS induced by the MESH incorporates a scattering mechanism on top of the LED and extracts the light in the active material's wave-guide mode. Secondly, as shown in the simulation (published elsewhere), PlaCSH has several plasmonic resonances and subwavelength cavity effect. When the emission light wavelength matches these resonance, the light will be coupled into these cavity mode and has chance to be enhanced. Finally, both the photon density of states and the local electromagnetic field amplitudes alter the radiative recombination rate due to the Purcell effect, surface plasmons induced by the MESH and PlaCSH enhanced the fluorescence efficiency of the active material, so also enhance the internal quantum efficiency of the LED device.

Figure 11:
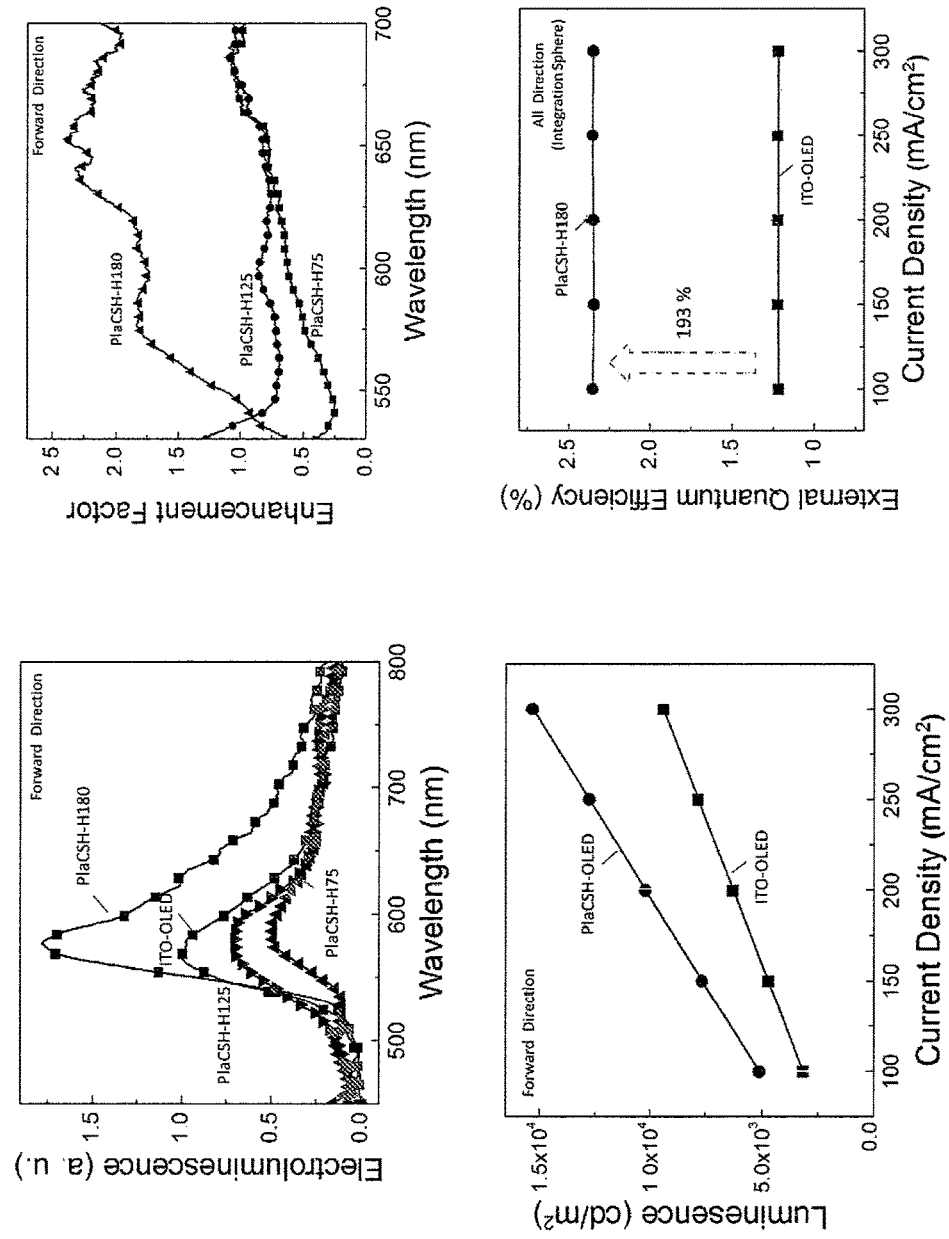
FIG. 11 are four charts illustrating normal direction brightness and total External Quantum Efficiency (EQE) enhancement of PlaCSH-LED. Measured normal direction fluorescence (a) and enhancement (b) spectrum for PlaCSH-LED with 15 nm thick Au MESH's with 3 different hole diameters (180, 125, and 75 nm) and ITO-LED under same current density of 200 mA/cm$^2$. The relationships between normal direction brightness, total EQE and current density are given in (c) and (d). The PlaCSH-LEDs with 100 nm thick active layer and 15 nm thick Au MESH of 180 nm diameter holes have achieved highest normal direction brightness of 10200 cd/m² and total EQE of 2.35%, which is 63% and 93% higher than ITO-LED (6270 cd/m² and 1.35%) respectively.

From the luminescence spectrums of all three PlaCSH-LEDs and ITO-LED shown in FIG. 11, PlaCSH-LEDs have red-shift central wavelength and wider FWHM (central wavelength 579 nm and FWHM 106 nm for PlaCSH-75H, central wavelength 580 nm and FWHM 101 nm for PlaCSH-125H, central wavelength 578 nm and FWHM 98 nm for PlaCSH-180H) compared with ITO-LED (central wavelength 570 nm and FWHM 85 nm). This central peak shifts and broadened FWHM might result from the coupling between the light generated inside the device and PlaCSH's cavity mode.

As shown in the forward direction enhancement spectrum FIG. 11, PlaCSH-75H, PlaCSH-125H and PlaCSH-180H have 50%, 72% and 181% of the intensity of the ITO-LED at their central wavelength of 579 nm, 580 nm and 578 nm respectively. Highest brightness with PlaCSH-H180 among all three PlaCSH devices is partially due to the highest transmission of 79% for 180H-MESH as shown previously. Even though PlaCSH-H75 and PlaCSH-H125 have similar cavity structure and similar working mechanism, but more light is enhanced and trapped in the cavity and loses into heat before escaping from the cavity due to the low transparence for MESH-H75 and MESH-H125.

93% enhanced total External Quantum Efficiency (EQE) of PlaCSH-LED. The total EQE of PlaCSH-LED and ITO-LED was measured with an integrated sphere and a calibrated reference lump (Newport. Inc.). Under same current density, PlaCSH-LED has total EQE of 2.35%, which is 93% higher than ITO-LED (1.35%) as shown in FIG. 11, which is also much higher than the previous highest EQE (1.5%-2.0%) based on the same material system. By calculating the illumination power over the electrical power, PlaCSH-LED has power efficiency of 2.59 lm/W, which is also 87% higher than ITO-LED (1.38 lm/W). This means that PlaCSH-LED not only enhance the normal direction illumination, but also the illumination in all the directions.

Figure 12:
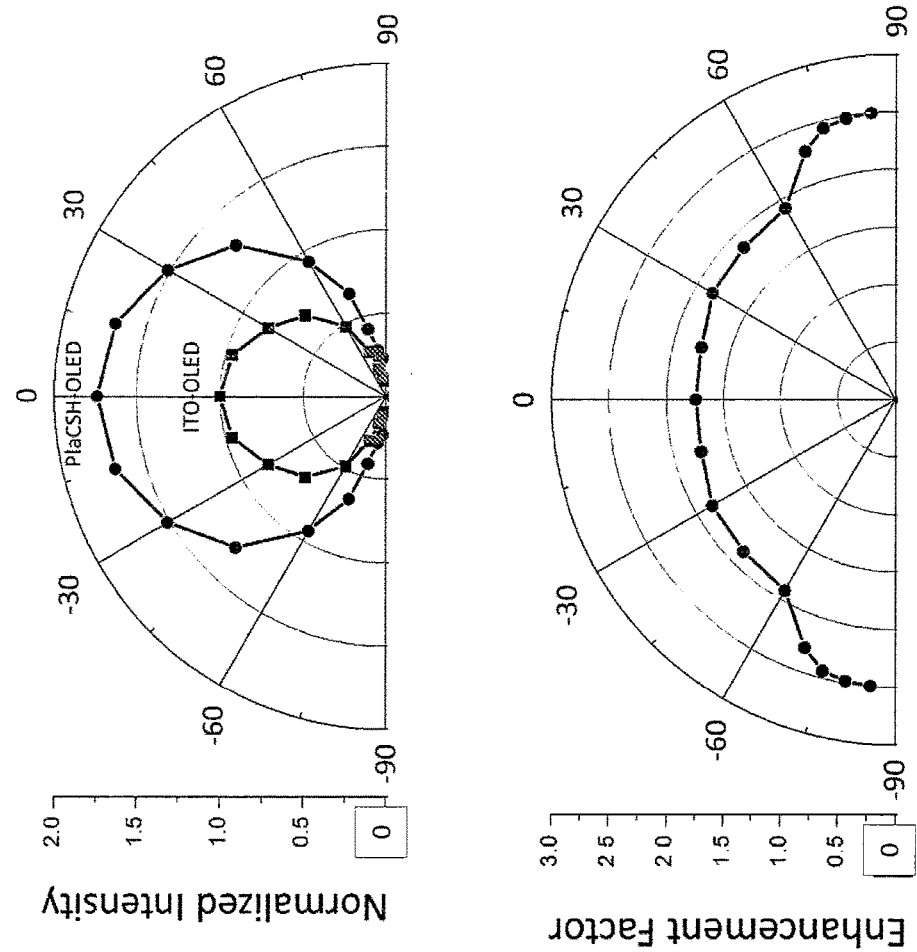
FIG. 12 are four charts illustrating angle emission enhancement and profile modifications due to the PlaCSH structure. Measured far-field intensity distribution patterns (a) and enhancement (b) show a clear enhancement in the normal emission about 174% and the total integrated emission about 190% (not including edge emission) of PlaCSH-LED compared with ITO-LED. At the angles of 0 degrees, 30 degrees, 60 degrees, and 80 degrees, the enhancement of PlaCSH-LED is 174%, 184%, 190% and 249% respectively.

Angle emission enhancement and profile changes due to the PlaCSH structure. Far-field intensity distribution patterns were measured for PlaCSH-LED and ITO-LED as shown in FIG. 12. Compared with ITO-LED, a clear enhancement in the normal emission about 174% and the total integrated emission about 190% (not including edge emission) of PlaCSH-LED was observed. At the angles of 0 degree, 30 degrees, 60 degrees, and 80 degrees, the enhancement of PlaCSH-LED is 174%, 184%, 190% and 249% respectively.

PlaCSH structure also offers advantages beyond pure extraction enhancement. As shown in the FIG. 12, PlaCSH-LED also changes the shape of far field distribution pattern. In this case, larger enhancement is observed in the large angle, which means the PlaCSH-LED-pattern is more flat compared with ITO-LED-pattern. We believe this pattern shape can be tuned by the PlaCSH structure parameters as MESH periods, hole diameters or cavity length. So it is possible to reshape the emission profile of the LED by engineering the parameters of the PlaCSH structure. These could be of great advantages for certain applications as head lamps, imaging or nonimaging optics.

Figure 13:
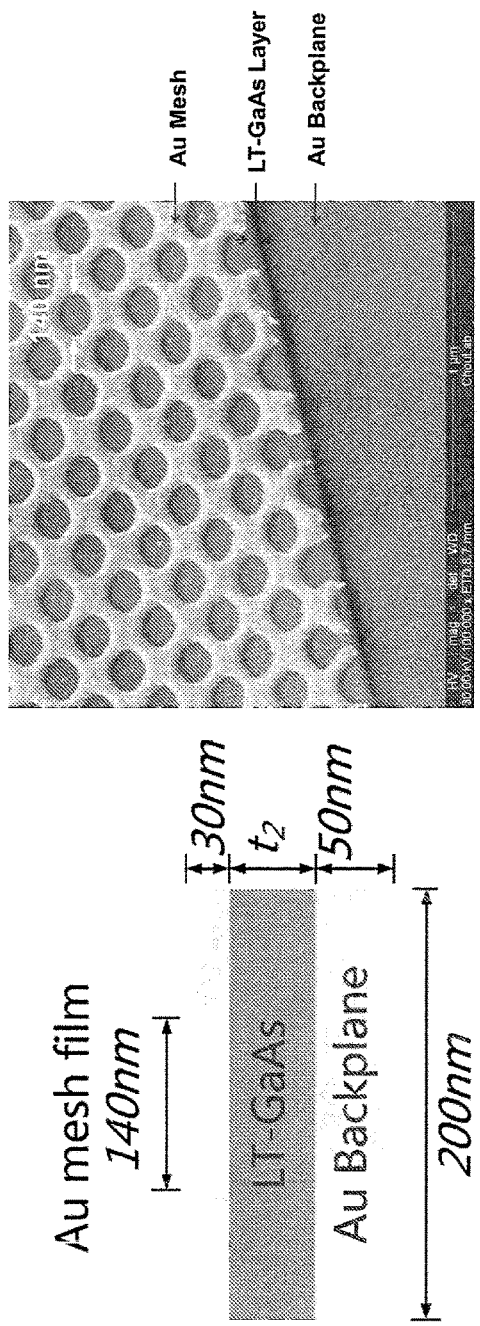
FIG. 13 is a schematic, fabricated, measured and simulated one embodiment of the invented photoelectron source, termed "plasmonic-enhanced nanostructured electron-source (PNE)"
Figure 13:
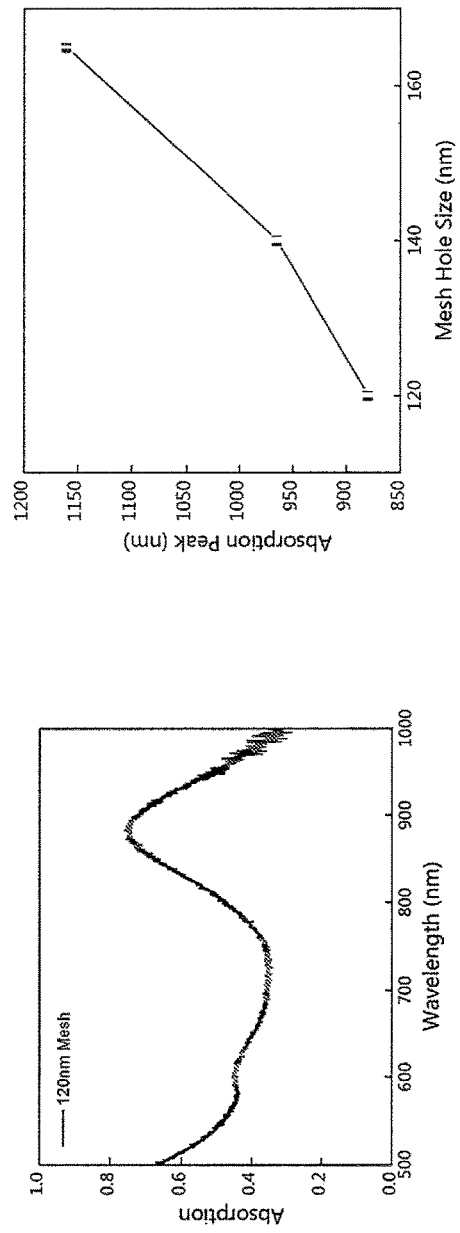

Example 2. Plasmonic-Enhanced Nanostructured Electron-Source (PNE) Using LT-GaAs and Metallic Photonic Resonant Cavity We have fabricated, measured and simulated one embodiment of the invented photoelectron source, termed "plasmonic-enhanced nanostructured electron-source (PNE)", which comprises a metallic photonic resonant cavity which further comprises: a thin top metallic layer that is light transmissive, a bottom metallic layer, and a photoelectron-emission layer between the top and bottom metallic layers, and the photoelectron-emission layer includes a photoelectron-emission material that, upon an irradiation of incoming photons, produce electrons (termed "photoelectrons) and the photoelectrons come to the free space outside the photoelectron-emission layer (FIG. 13).

In the fabrication, the first was the growth of LT-GaAs samples. The 50 nm LT-GaAs film (which is the photoelectron-emission layer) is grown on normal GaAs substrate at 250□ by using Molecular Beam Epitaxy (MBE). In between the LT-GaAs film and GaAs substrate, there is a 50 nm AlxGa1-xAs (x=0.85) film as a sacrificial layer for the future lift-off of LT-GaAs film from the substrate. First, a gold mesh layer is pattern on top of as-grown LT-GaAs samples by nanoimprint technique. The thickness of gold mesh is about 30 nm and the hole array is of 200 nm period with 140 nm diameter for each hole. Then, the samples are cut into 1 cm□0.5 cm pieces. A special type of wax is coated on the top surface of each piece. Next, the small pieces are immersed in 10% w.t. HF solution for 24 hours at room temperature. In this process, the sacrificial layer of AlxGa1-xAs (x=0.85) will be etched off. And eventually, the wax together with patterned LT-GaAs film will fall off. Meanwhile, a thick layer of gold film (about 50 nm) is deposited on Silicon wafer by e-beam evaporation. It will serve as the substrate for PNE. Next step is to bond the lifted off LT-GaAs film to this substrate. The patterned LT-GaAs film (wax on top) is placed on the substrate with LT-GaAs film side facing the gold film. A moderate pressure is exerted on them for about 5 minutes. Due to Van der Waals forces, the LT-GaAs film will be attached onto the substrate. After dissolving away the top wax, PNE is ready for measurement.

For the PNE with 40 nm LT-GaAs film and 30 nm gold mesh (140 nm diameter holes), the absorption peak is around 800 nm and its corresponding absorption is about 85%.

In the simulation, we set the period of gold mesh film to be 200 nm and the gold backplane to be 50 nm. The thickness of gold mesh layer, the hole size in mesh layer as well as the thickness of LT-GaAs film are varied for the purpose of optimization. According to the simulation, the absorption peak of PNE is mainly affected by the thickness of LT-GaAs film and hole size. When thickness of LT-GaAs film or hole size increases, the absorption peak will red-shift. However, the thickness of gold mesh layer only influences the intensity of absorption at the absorption peak. For the optimized structure, the thickness of gold mesh layer is 30 nm with 140 nm diameter holes and the thickness of LT-GaAs film is 40 nm. In the optimized structure, the absorption peak is around 800 nm and the corresponding absorption is larger than 98%. At the absorption peak, most energy of incident light is focused right under the center of holes inside LT-GaAs film. Therefore, it means most photoelectrons will be generated right under the holes instead of under the gold ribs of gold mesh. This will be helpful for the extraction of photoelectrons.

Example 3. Ultrathin, High-Efficiency, Broad-Band, Omni-Acceptance, Organic Solar Cells Using Metallic Photonic Resonant Cavity with Subwavelength Hole Array We have implemented and demonstrated the photodetector invention in a new organic solar cell, which is termed "plasmonic cavity with subwavelength hole-array (PlaCSH) solar cell". A PlaCSH solar cell comprise a metal-mesh electrode with subwavelength hole-array (MESH) as a transparent front electrode for the top metallic layer, a metal (gold) back electrode for the bottom metallic layer, and in-between a thin light absorbing photovoltaic active material layer. The three layers together form a type of metallic photonic resonant cavity, termed 'MESH/absorbing active layer/metal (MESH/A/M) plasmonic cavity. Light will enter from MESH side. When MESH is alone, because its features are subwavelength, the incident light cannot generate any non-zero order diffractions but large evanescent waves near MESH surfaces, which lead to either light reflection or transmission depending on MESH's particular features. However, the formation of a proper MESH/A/M plasmonic cavity can couple and confine the evanescent waves, originally at both surfaces of MESH, into the absorbing photovoltaic layer. As a result and to be shown later, a PlaCSH-SC can extremely efficiently couple the incoming light into the active layer (i.e., very low reflectivity) with little reflection without using any other antireflection structures (e.g., roughened surfaces); and can extremely efficiently trap the light in the active layer, so that high absorption is achieved using ultrathin active layer thickness which is only a small fraction of absorption length.

In this demonstration, we used poly(3-hexylthiophene)[6, 6]-phenyl-C61-butyric acid methyl ester (P3HT/PCBM) bulk hetero-junction of sub-absorption length thickness as the photovoltaic active layer of a PlaCSH-SC (Certainly other sub-absorption length thick organic or inorganic photovoltaic active materials can be used as well). And our current study has focused on the effects of PlaCSH-SC structure parameters on solar cell performance, rather than the effects of polymer materials, compositions or processing conditions. We used all polymers as received from commercial venders and processed them using conventional methods, except filtering with 450 nm filter size.

Figure 14:
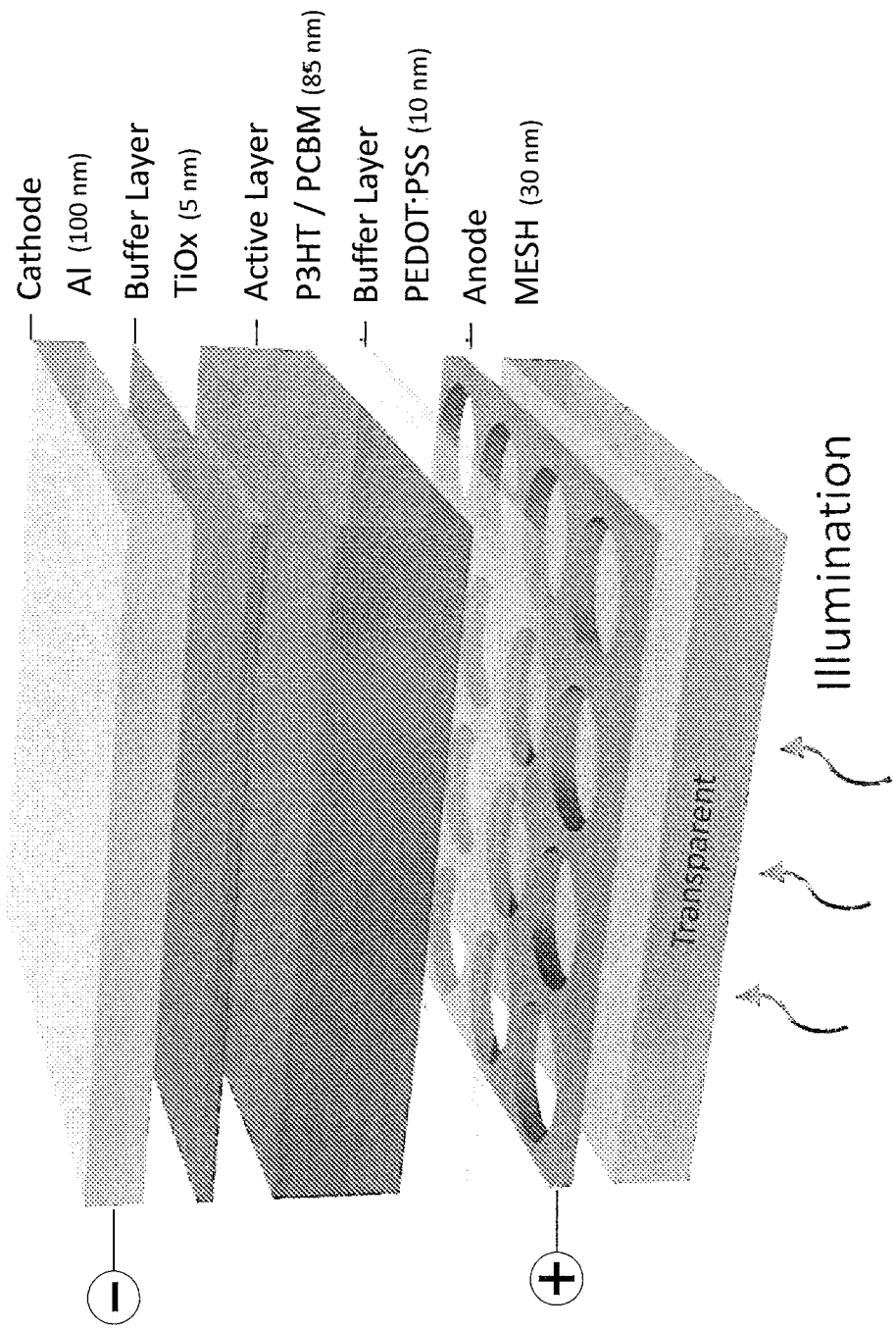
FIG. 14 is a schematic of Plasmonic Cavity with Subwavelength Hole-array (PlaCSH) Solar Cell (SC). PlaCSH-SC consists of Au metallic electrode with subwavelength hole-array (MESH) and a Al backplane, sandwiches P3HT/PCBM, TiOx, and PEDOT:PSS layers between the two electrodes.
Figure 15:
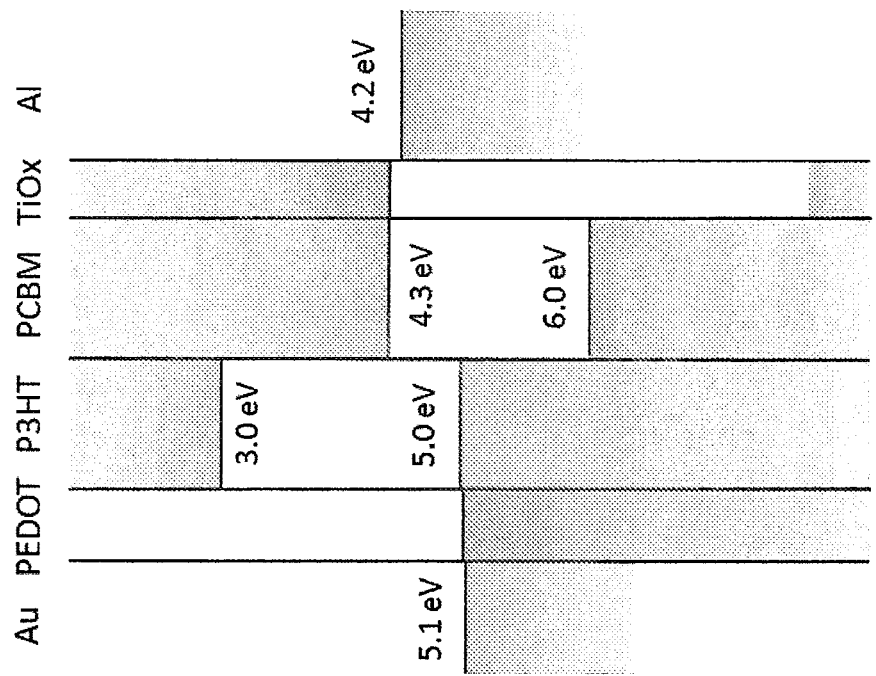
FIG. 15 is an energy band diagram of PlaCSH-SC.

A PlaCSH solar cells with an optimized structure has a 30 nm thick gold MESH with a hole array of 175 nm diameter and 200 nm period (as transparent electrode) on a fused silica substrate, 10 nm thick poly(3,4-ethylenedioxylenethiophene):polystyrene sulfonic-acid (PEDOT:PSS) layer (electron blocking layer), 85 nm P3HT/PCBM film (active layer), 5 nm thick TiOx (hole blocking layer) and 100 nm thick Al film (back electrode) (FIG. 14). The incident light enters the solar cell from transparent silica substrate side through the transparent MESH. Excluding the thickness of the Al electrode and the substrate, the total thickness of the device (the active layer, the transparent front contact, and charge blocking layers) is 130 nm.

Figure 16:
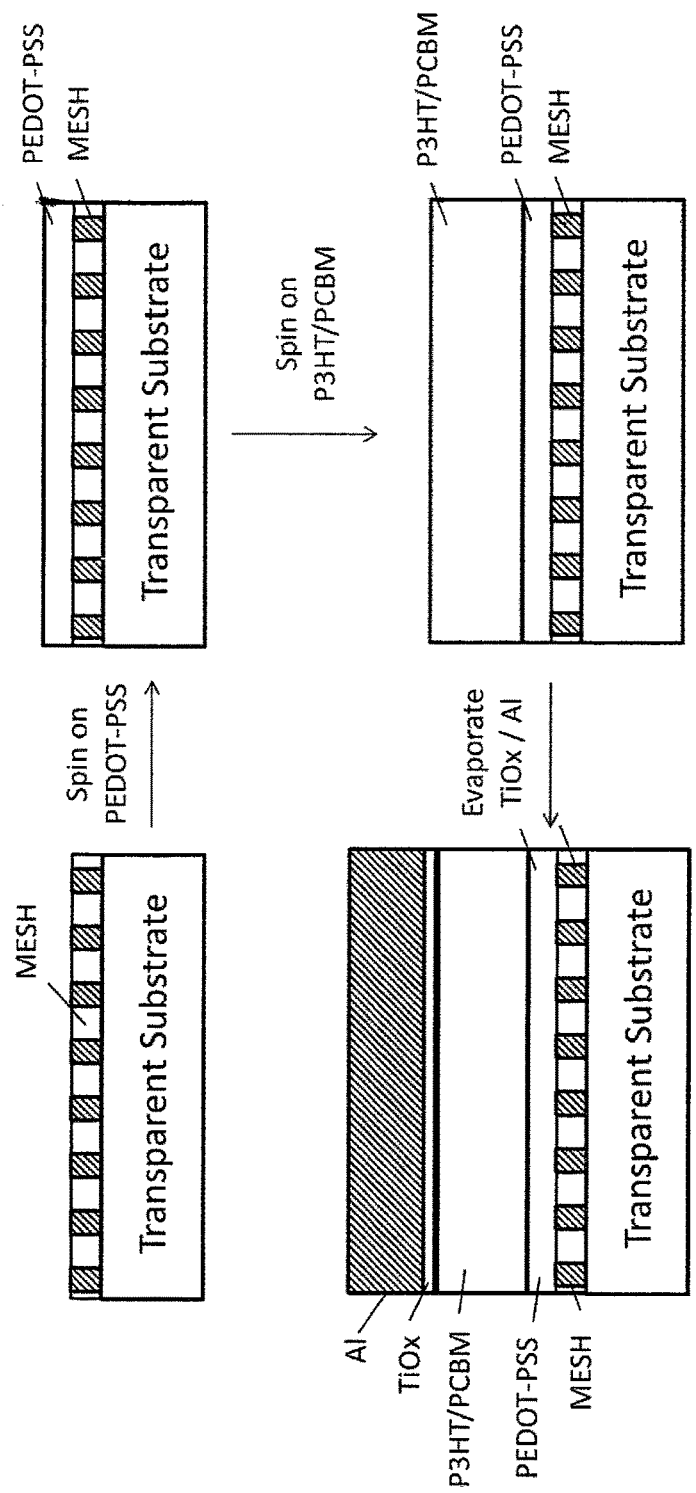
FIG. 16 are four schematics illustrating one method of fabrication of a PlaCSH-SC including fabrication of MESH by nanoimprint on fused silica substrate, spinning of PEDOT:PSS buffer layer and P3HT/PCBM active layer, and thermal deposition of TiOx buffer layer and Al electrode.

Fabrication. PlaCSH solar cells were fabricated on 4" fused silica substrates (index=1.5). First, MESH was fabricated by nanoimprint lithography using a 4" mold with sub-wavelength pitch and diameter holes over entire mold area (FIG. 16) and deposition and lift-off of Au. The mold was a daughter mold duplicated by nanoimprint from a master mold which was fabricated by interference lithography and multiple nanoimprints. Then the 4" MESH wafers were cut into 1 in.×1 in. squares; followed by spinning, in N2 environment, the PEDOT:PSS (annealed 15 min at 120 degrees) and the P3HT/PCBM (5:4 ratio) in chlorobenzene (PEDOT:PSS from Sigma Aldrich, P3HT from Rieke Metals, PCBM from Nano-C), and then dried in covered glass petri dishes for 20 min Finally the TiOx and Al film were evaporated through a shadow-mask to define the back electrode, followed by a post annealing at 150 degrees for 30 min in N2. A typical active area of each device, defined by the back electrode, is 3 mm by 3 mm (The samples were exposed to air for a short time during the transfers between a glove box and evaporator.)

For comparison, also fabricated were the reference solar cells, "ITO-SCs", which have the exact same device structure/materials/geometry as the PlaCSH-SCs except that the MESH is replaced by a 100 nm thick ITO. Since ITO has a plasmon wavelength of about 1.2 um, ITO-SC does not have a plasmonic cavity in the wavelength range of current study. The ITO was deposited on a fused silica substrate and was annealed at 450 □ for 1 h, and after that the ITO-SCs were fabricated together with PlaCSH-SCs in the same batch.

Figure 17:
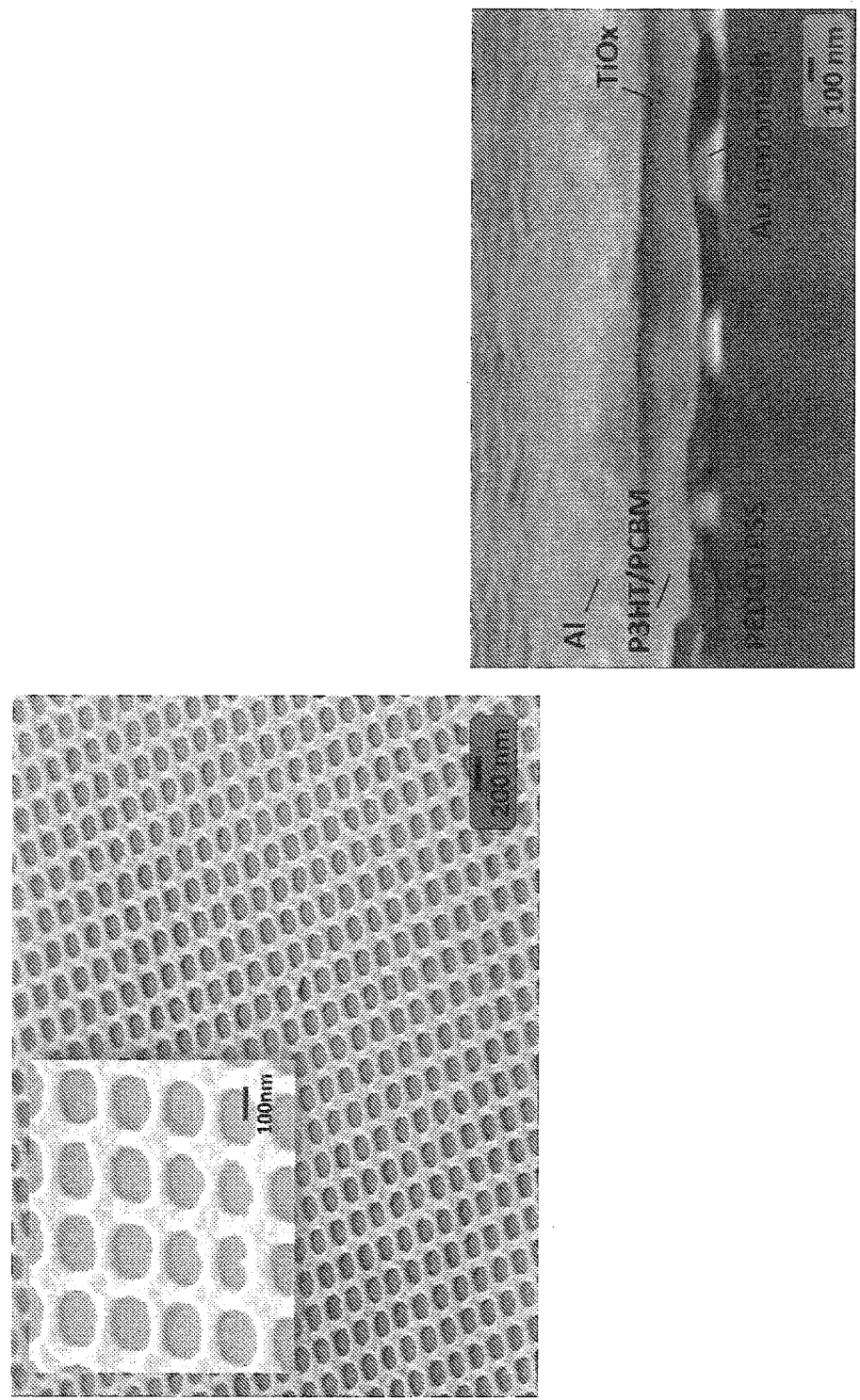
FIG. 17 is a tilt-view scanning electron micrograph (SEM) of Au MESH with 175 nm diameter and 200 nm pitch hole array, and Cross-sectional SEM of PlaCSH solar cell.

Scanning electron microscopy (SEM) of fabricated MESH shows that the hole shape is close to square with round corners and smooth edges, and that the MESH is uniform over large area (FIG. 17). SEM of the cross-section of PlaCSH solar cells further confirms that the fabricated devices have the correct structure as intended. The optical images under the Sun light show that PlaCSH-SC is black in color, while ITO-SC is dark magenta, which are related to the optical absorption spectrum of each device type as discussed later.

Figure 18:
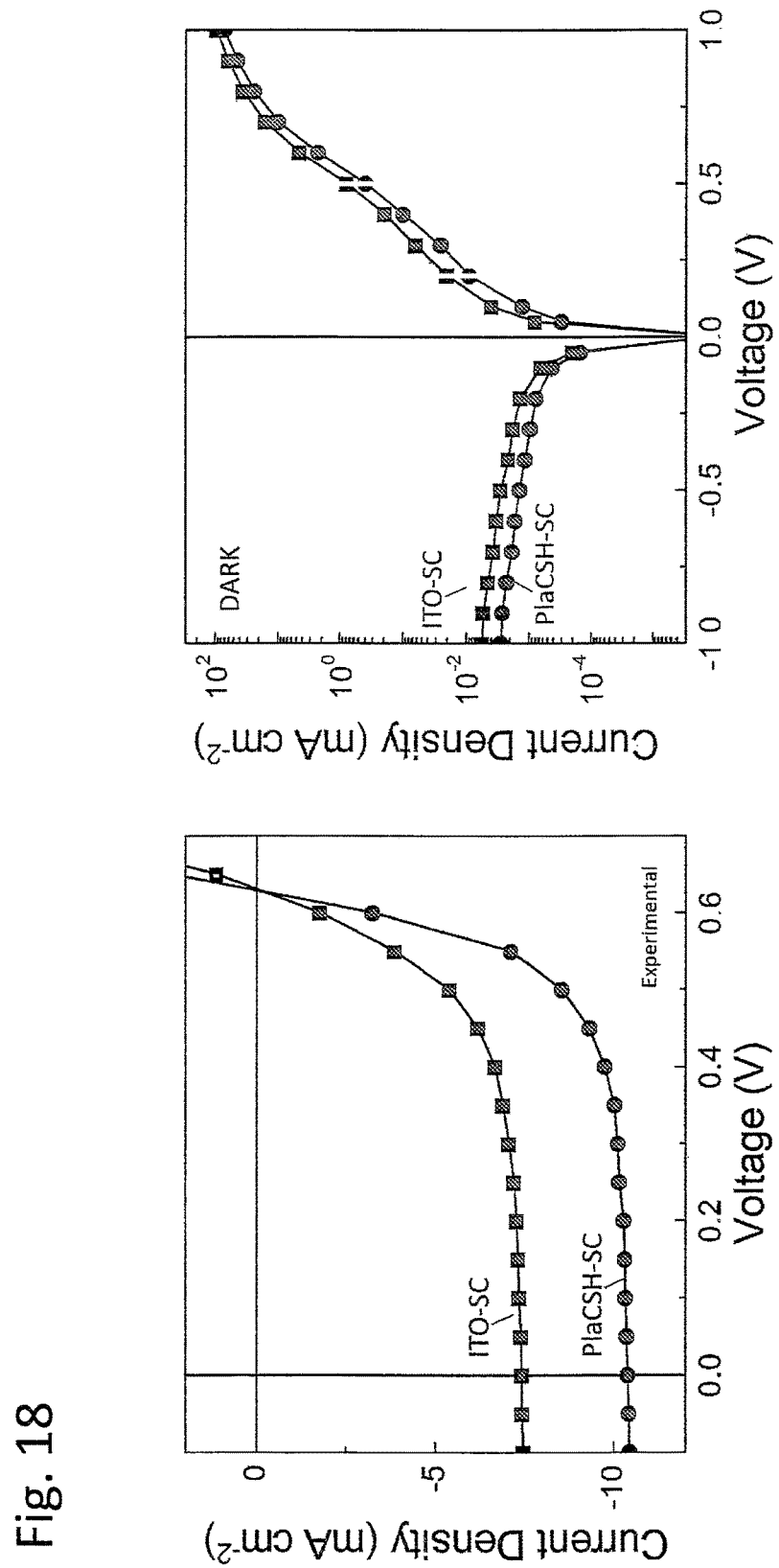
FIG. 18 are two charts illustrating a photocurrent of PlaCSH-SC and reference ITO-SC. Typical J-V characteristics measured under 100 mW/cm² AM 1.5 global solar irradiation (a) and in the dark (b). PlaCSH-SC has an open-circuit voltage (Voc) of 0.62 V, a short-circuit current density (Jsc) of 10.4 mA/cm², a fill factor (FF) of 67%, and a power conversion efficiency ($\eta$eff) of 4.4%; while ITO-SCs have Voc=0.62 V, Jsc=7.4 mA/cm², FF=63%, and $\eta$eff=2.9%. PlaCSH-SCs have enhanced power conversion efficiency by 52%, and Jsc, and FF by 41% and 6% respectively.

PlaCSH-SC's J-V and Power Conversion Efficiency. Under 100 mW/cm$^2$ air mass 1.5 global solar irradiation (AM1.5G) from a solar simulator, the typical measured current density vs. voltage (J-V) curves of the optimized PlaCSH solar cells exhibit an open-circuit voltage (Voc) of 0.62 V (The Al electrode is the ground), a short-circuit current density (Jsc) of 10.4 mA/cm$^2$, a fill factor (FF) of 67%, and a power conversion efficiency (ηeff) of 4.4%; while typical ITO-SCs (the reference) have Voc=0.62 V, Jsc=7.4 mA/cm$^2$, FF=63%, and ηeff=2.9% (FIG. 18). Compared to ITO-SCs, PlaCSH-SCs have enhanced power conversion efficiency by 52%, and Jsc, and FF by 41% and 6% respectively. Even without optimizing the polymer composition and processing conditions, the achieved power conversion efficiency in PlaCSH-SCs is among the highest for P3HT/PCBM material system, which was previously achievable using active materials several times thicker (e.g., 200 to 250 nm) or optimized polymer compositions and treatments, or both.

The J-V characteristics in dark were measured and showed that the saturation current in PlaCSH-SCs is slightly smaller than the ITO-SCs (FIG. 18), possibly due to better molecular orientation and crystallinity of P3HT/PCBM layer on an ordered texture surface (e.g., MESH) than the flat surface of ITO.

Figure 19:
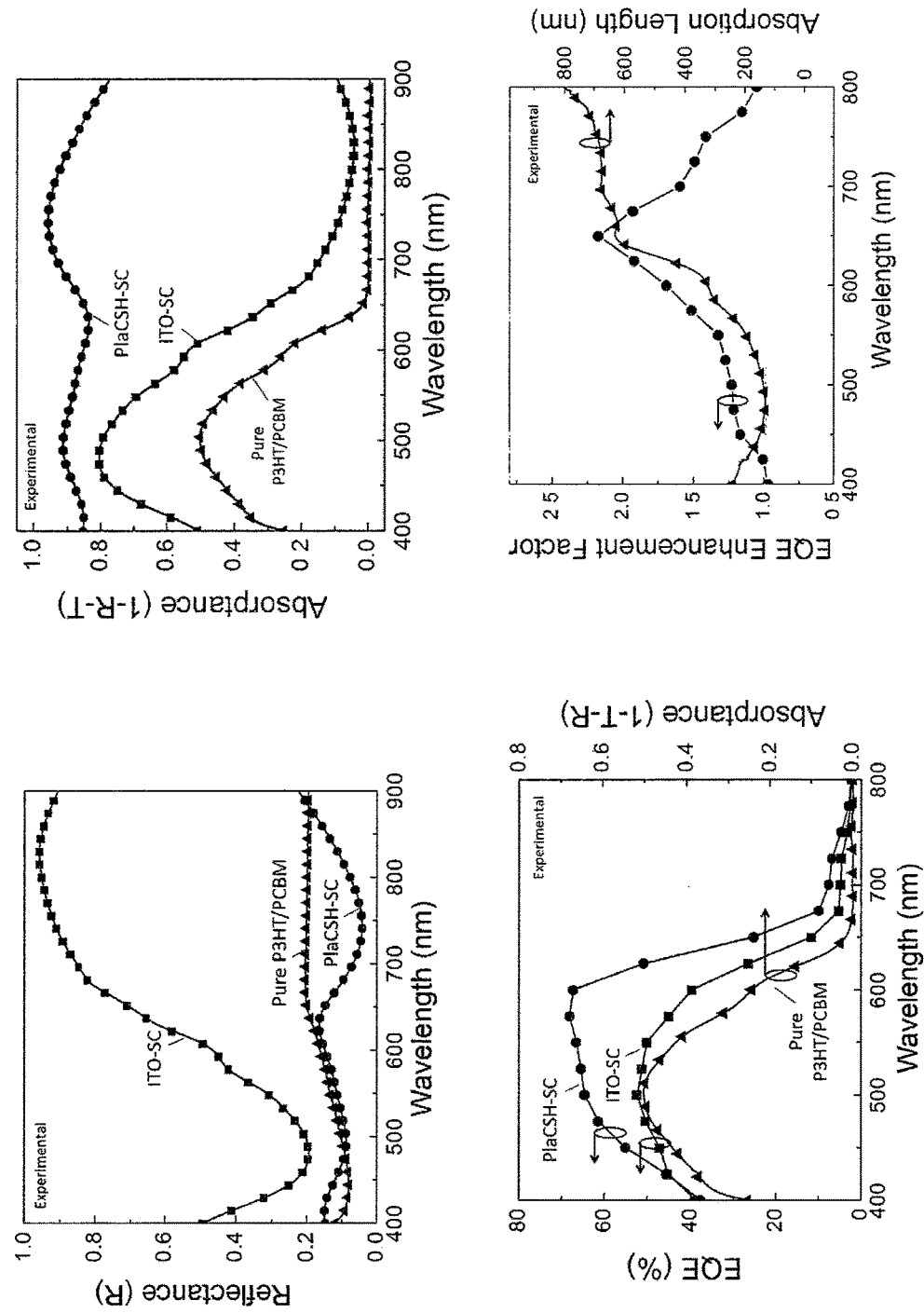
FIG. 19 are four charts illustrating Normal Incident Reflectance, Absorptance and EQE spectra of PlaCSH-SC, ITO-SC, and P3HT/PCBM (85 nm thick on glass). Measured normal incident optical reflectance spectrum (a) and measured absorptance spectrum (1-reflectance-transmittance). PlaCSH-SC has a normal incident reflectance as low as 5% and 10% average and absorptance as high as 96% and 90% average over a broad band (400 to 900 nm). ITO-SC has normal incident reflectance of minimum 20% and 56% average, and absorptance 80% maximum and 44% average. Measured external quantum efficiency (EQE) spectrum of PlaCSH-SC and ITO-SC as well as the measured absorptance spectrum of 85 nm thick P3HT/PCBM film on glass (c), and EQE enhancement (EQE ratio of PlaCSH-SC to ITO-SC), and measured absorption-length in P3HT/PCBM (d). PlaCSH-SC achieved a maximum EQE of 69% at 575 nm wavelength where the 85 nm thick active layer's single pass absorptance is only 27%. And PlaCSH-SC has an EQE enhancement factor always larger than one over the entire measured spectrum range, and can be as high as 2.2 fold (220%) at 650 nm.

PlaCSH-SC's Large External Quantum Efficiency (EQE). The EQE spectra of both PlaCSH-SCs and ITO-SCs were measured using a Xenon lamp (150 W Oriel), monochrometer, a calibrated photodetector and collimation optics (for forming parallel normal incident light beam) (FIG. 19). PlaCSH-SCs have a maximum EQE of 69% at 575 nm, which is 33% higher than ITO-SCs (52% at 500 nm) and red-shifted. PlaCSH-SCs have a higher EQE over the entire measured wavelength range (350 to 800 nm) with an EQE enhancement factor (defined as the ratio of EQE of PlaCSH-SC to ITO-SC) as high as 2.2 fold (220%) at 650 nm (FIG. 19).

The measured EQE spectra offer another way to estimate Jsc, which can be obtained by integrating the measured EQE spectrum with standard AM 1.5G solar spectrum, leading to 10.3 and 7.4 mA/cm$^2$ for PlaCSH-SC and ITO-SC, respectively. This is in excellent agreement with that obtained from the direct J-V measurements, i.e., 10.4 and 7.4 mA/cm$^2$. The agreement also provides a good crosscheck of our solar simulator and EQE measurements.

Pure-P3HT/PCBM Layer's Absorptance and Relationship to EQE. To understand the high EQE in PlaCSH, we measured (i) the absorptance spectrum of a 85 nm thick P3HT/PCBM film on a fused silica substrate (pure-P3HT/PCBM film) (FIG. 19) and (ii) the transmittance spectrum of 42 nm, 72 nm, and 92 nm thick P3HT/PCBM film on glass to obtain absorption-length spectrum (FIG. 19).

Compared to the measured pure-P3HT/PCBM absorptance spectrum, the EQE spectrum of ITO-SC has an identical peak wavelength and almost the same shape, indicating that the EQE in ITO-SC is dominated by the absorption in the photovoltaic active-layer and there is little cavity effect. However, the EQE spectrum of PlaCSH-SC differs significantly from pure P3HT/PCBM absorptance spectrum in peak wavelength (575 nm rather than 500 nm), peak value, and spectrum shape (broadband vs. narrow band). These differences are due to the cavity effect of PlaCSH as further discussed below.

The absorption length in pure-P3HT/PCBM film measured from the light transmission is 138 nm and 267 nm at 500 and 575 nm wavelength respectively, and 250 nm when averaged over 400 to 650 nm wavelengths (FIG. 19), which are consistent with the direct absorptance spectrum measurements of a 85 nm thick film on glass. From the measured absorption-length, we can calculate single-pass absorptance in the P3HT/PCBM active layer, which is merely 27% for a 85 nm thick film at 575 nm wavelength. Yet the EQE of the PlaCSH-SC with such thin active layer is 69%. Such high EQE achieved in sub-absorption length active material is due to a good light trapping in the cavity of PlaCSH-SC, where the cavity makes light bounce back and forth several times. Without a cavity, like ITO-SC, the EQE is much lower as shown by the measurements (FIG. 19).

Broad-bandwidth, Up-to-96% Light Coupling and Absorptance in PlaCSH Solar Cell. We measured the normal incident reflectance spectra (R) (400 to 900 nm wavelength) of PlaCSH-SCs and ITO-SCs, and then obtained the normal incident absorptance spectra (A) using 1-R-T, where transmittance (T) is zero in the SCs (FIG. 19). We found that for the optimized PlaCSH-SCs, they have (a) a low normal incident reflectance of a minimum of 4.3% (at 750 nm wavelength) and an average of 10%, and hence a high absorbance of a maximum of 95.7% and an average of 90%; (b) a broad bandwidth (400-900 nm) for the low reflectance and high absorptance—nearly constant over the entire bandwidth measured, (c) a reflectance that can be even lower than the reflectance directly from pure P3HT/PCBM layer on glass, and (d) an absorptance spectra is drastically different from that of pure P3HT/PCBM layer on glass.

For ITO-SCs, on the other hand, the normal incident reflectance and absorptance are significantly worse than PlaCSH-SCs, and have spectrum behavior drastically different from PlaCSH-SCs but similar to (hence dominated by) the P3HT/PCBM active layer absorptance, which is a narrow band. The ITO-SC's normal incident reflectance has a minimum of 20% (at 482 nm wavelength) and an average of 56%, giving an absorptance of a maximum of 80% and an average of 44%.

At the wavelength of 500 nm (absorption peak for pure P3HT/PCBM layer) 575 nm (EQE peak for PlaCSH-SC) and 790 nm (outside of P3HT/PCBM absorption), the absorptance in PlaCSH is 1.13, 1.4 and 18 fold higher than ITO-SC, respectively (FIG. 19. The broadband high absorption and low reflection in PlaCSH-SC are due to good light coupling and trapping in PlaCSH.

Since the incident light enters from the substrate size, the air and the fused silica substrate has a normal incident reflectance of 4%. Substrate this reflection, the normal incident reflectance of PlaCSH-SC can be as low as 0.3%.

Figure 22:
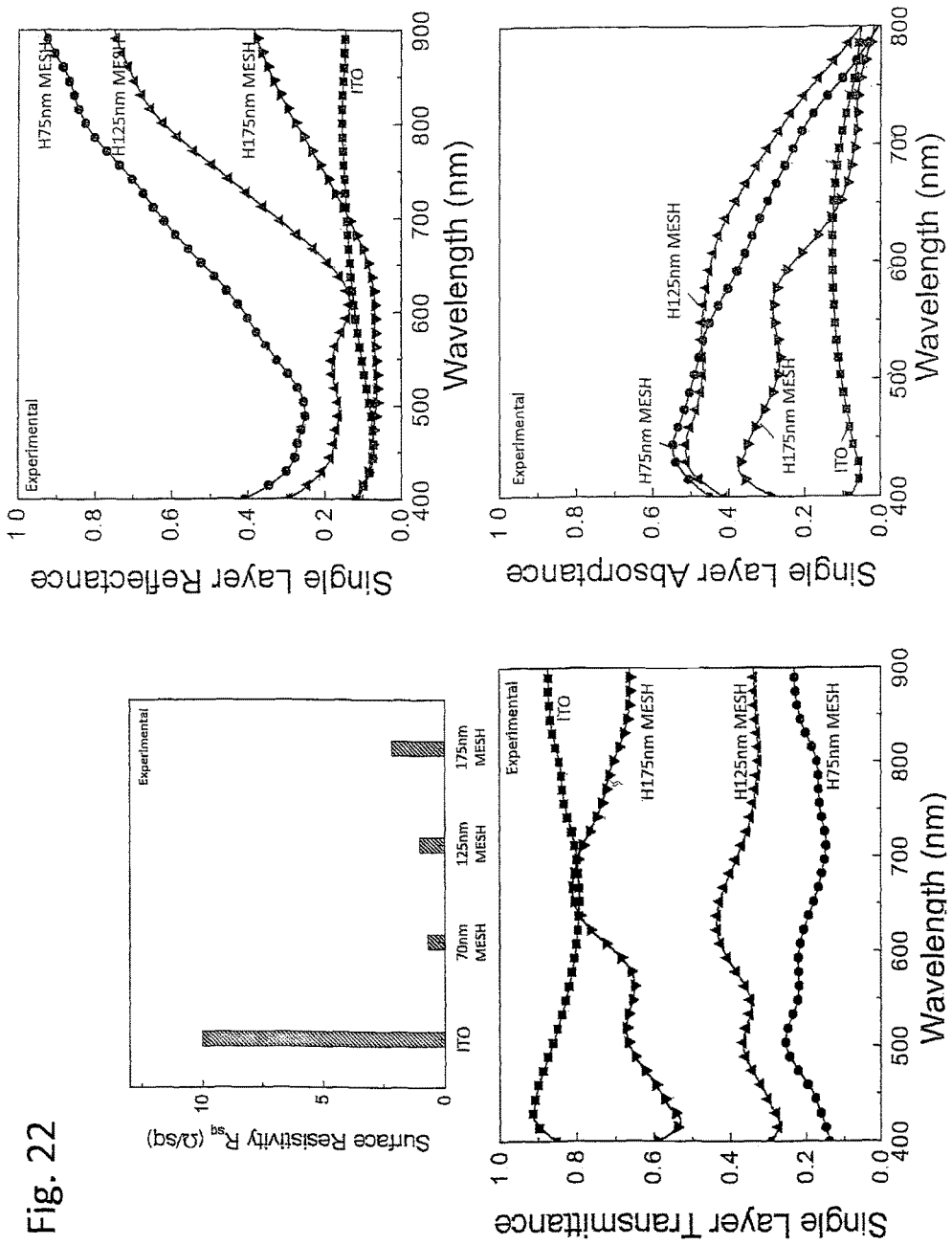
FIG. 22 are four charts illustrating Optical and electrical properties of metallic electrode with subwavelength hole-array (MESH). Measurements of sheet-resistance (a), reflectance (b), transmittance (c), and absorptance (d) of 30 nm thick Au MESHs with 75 nm, 125 nm and 175 nm hole size, 200 nm period and the 100 nm thick annealed ITO film. The measured sheet-resistance is 10 ohm/sq for of the ITO, but 2.2 ohm/sq or less for the MESH's—making them at least 4.5 fold better. The smaller the hole diameter is, the smaller the sheet resistance of MESH, but higher light reflectance and absorptance. Compared with FIG. 4, after PlaCSH-SC formation, both the reflectance and absorptance of MESH drop significantly by 2 to 5 fold in reflectance and as large as 6.7 fold in absorptance at 500 nm wavelength. In contrast, for the ITO, the reflectance, after ITO-SC formation, increases drastically by 2 to 5.8 fold.

Electrical and Optical Properties of MESH-Only on Glass. To better understand PlaCSH, we measured the properties of each of its components. Beside the active layer (discussed above), we measured the sheet-resistance as well as the spectra of reflectance, transmittance and hence absorptance of (a) 30 nm thick Au MESH's with 200 nm hole pitch and different hole diameters (175, 125, and 75 nm) on glass (i.e., fused silica) without any other components of PlaCSH (MESH-only), and (b) the annealed 100 nm thickness ITO on glass (ITO-only) which is identical to that used in ITO-SC (FIG. 22). In the optical measurements, the incident light enters from the glass substrates to have identical situation as the solar cells.

The sheet-resistance measurements (FIG. 22) show that (a) the 100 nm thick annealed ITO film has 10 ohm/sq sheet-resistance, among the best reported, indicating good ITO quality; (b) the MESH's have sheet-resistances much smaller than the ITO film: even the worst sheet-resistance (175 nm diameter holes) is still 2.2 ohm/sq—4.5 fold better than ITO; and (c) the smaller the hole diameter is, the smaller sheet resistance of MESH, but a higher light reflectance and absorptance. A smaller sheet resistance can improve fill-factor and power conversion efficiency, hence is highly desirable.

The reflectance measurements (FIG. 22) show (a) for the given 200 nm pitch, the larger the hole diameter of MESH is, the smaller the light reflectance; and (b) for 175 nm diameter holes the reflectance can be smaller than the ITO in wavelength of 470 to 700 nm.

The transmittance/absorptance measurements (FIG. 22) show (a) the absorptance of ITO is about 10% and nearly constant over the entire measured wavelength range; and (b) almost all MESH-Only's measured have an absorptance higher than ITO-only, except the MESH's with 175 nm diameter holes and at the wavelengths longer than 640 nm.

Comparison of MESH Optical Property Before and After PlaCSH-SC Formation. Interestingly, after PlaCSH-SC formation, we found that both the reflectance and absorptance of MESH drop significantly. The measurements show that at wavelength of 700, 750 and 800 nm, the reflectance for MESH-only is, respectively, 14%, 20% and 28%, but it drops to 7%, 4% and 8% after PlaCSH formation, leading to reflectance reduction ranging from 2 to 5 fold. In contrast, for ITO-SC, the reflectance has increased drastically: from 9% and 14% for ITO-only to 20% and 85% after SC formation at the wavelength of 500 and 700 nm, respectively, leading to reflectance increase by 2 to 5.8 fold. The increase in reflectance after ITO-SC formation is due to the additional reflections at the interfaces of P3HT/PBCM layer and the Al contact, while the decrease in reflectance after PlaCSH-SC formation is due to the cavity effects that lead to excellent light coupling and trapping in the active layer of PlaCSH-SC.

The reduction of light absorption in MESH after PlaCSH formation can be seen by analyzing the measured EQE's, reflectance and absorptance in PlaCSH-SC and ITO-SC. For ITO-SC measured at 500 nm wavelength, it has 20% reflectance, 52% EQE, and 10% ITO layer absorptance, leading to 18% of total incident energy (i.e., 26% of the energy after passing ITO film) becoming heat in the active layer and Al back electrode. For PlaCSH-SC measured at 500 nm wavelength, the reflectance is 9% and the EQE is 64.5%, hence the total energy in the active layer and Al electrode is 87%, if assuming PlaCSH-SC has the same ratio of electrical energy to heat energy in the active layer and Al electrode as ITO-SC. Thus, at 500 nm wavelength the absorptance in the MESH after PlaCSH formation is 4%, which is 6.7 fold smaller than 27% absorptance in MESH-only, and 2.5 fold smaller than 10% absorptance in the ITO film.

Our simulation shows that the reduction in light absorption in MESH after PlaCSH formation is attributed better light coupling into the active polymer layers when PlaCSH is formed (to be published elsewhere).

Moreover, compared to previous nanoscale metal wires used to replace the ITO transparent conducting electrode 10-14, the MESH's reported here have much smaller sheet resistance, lower reflectance and higher transmittance. Our simulations show that they are attributed to the properties related to the cavity effects as well as the subwavelength sizes in wire pitch and width and in hole size of PlaCSH (will report elsewhere).

Figure 20:
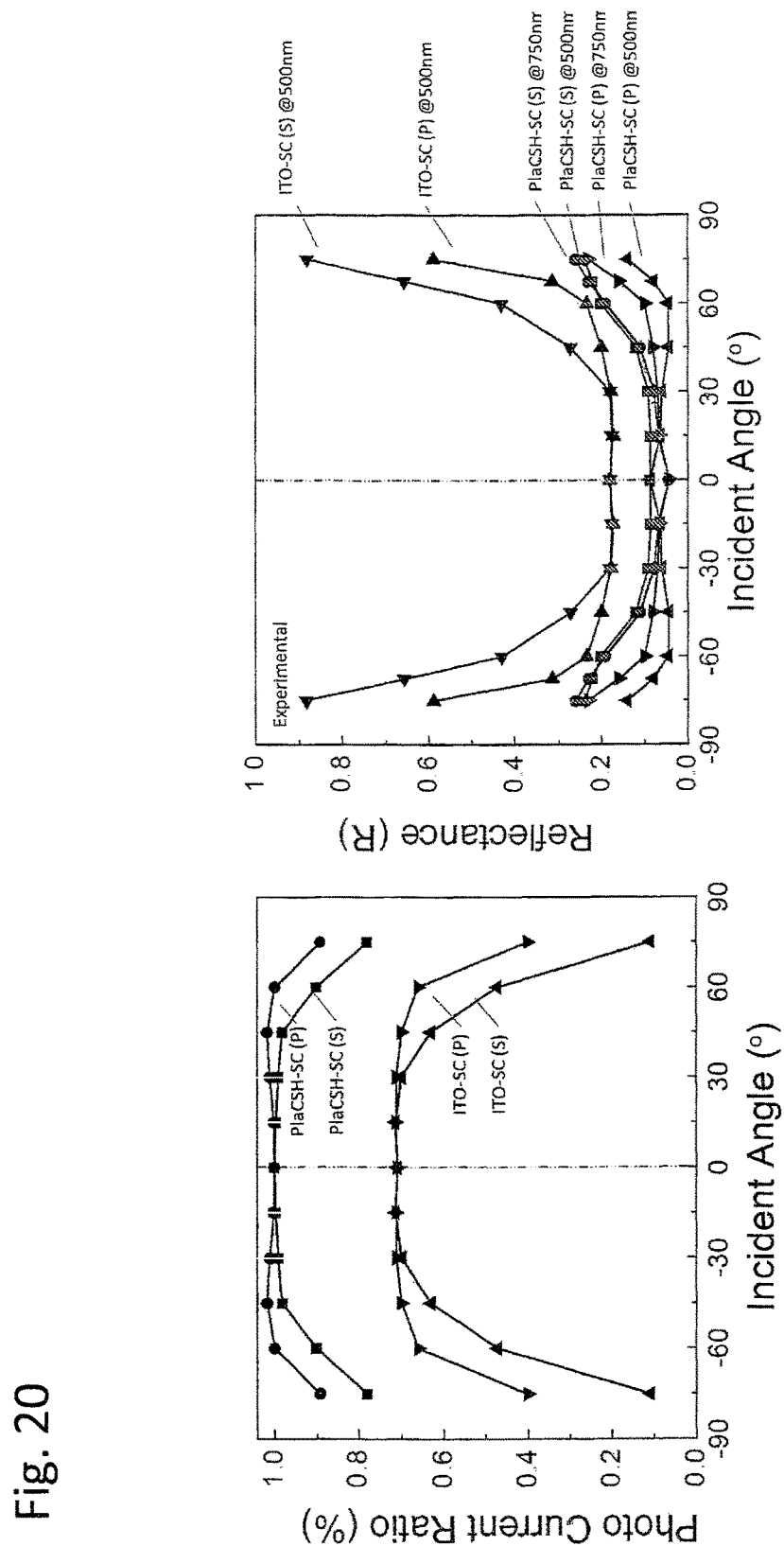
FIG. 20 are two charts illustrating a Broad-band Omni acceptance (near angle and polarization independence) in PlaCSH-SC. Measured incident light angle and polarization dependence of photocurrent under a white light (a), reflectance at 500 nm and 750 nm wavelength (b) for PlaCSH-SC and ITO-SC. They show that the angle and polarization dependence of photocurrent under white light in PlaCSH is significantly less than ITO-SC by a factor of 3 to 6 fold for s-wave and 4 to 7 fold for p-wave. The photocurrent changes observed are consistent with the measured reflectance changes.

Broad-Band, Omni Acceptance. We measured the effects of incident light angle (0 degrees to 75 degrees with a 15 degree increment) and polarization on the photocurrent and reflectance of PlaCSH-SCs and ITO-SCs (FIG. 20). (Note: The maximum incident angle can be measured is limited by the current SC device size). The photocurrents were measured using a polarized broad-band white light (halogen lamp) and is plotted in the relative change to the photocurrent of PlaCSH-SC for normal incident light (i.e., 0 degrees) (FIG. 20). The results clearly show that the PlaCSH-SC has much smaller angle and polarization dependence than ITO-SC. For examples, at incident angle of 45 degrees, 60 degrees and 75 degrees, the measured photocurrent change for PlaCSH-SC is only 1.8%, 10% and 22%, respectively, for s-wave, and 1.6%, 0.2% and 11% for p-wave; while the photocurrent change for ITO-SC is 11%, 34% and 85% for s-wave, and 1.4%, 7% and 43% for p-wave. This means that at angle greater than or equal to 45 degrees, the reflectance of PlaCSH-SC is 3 to 6 fold smaller (hence better) than ITO-SC for s-wave and 4 to 7 fold smaller for p-wave.

Figure 21:
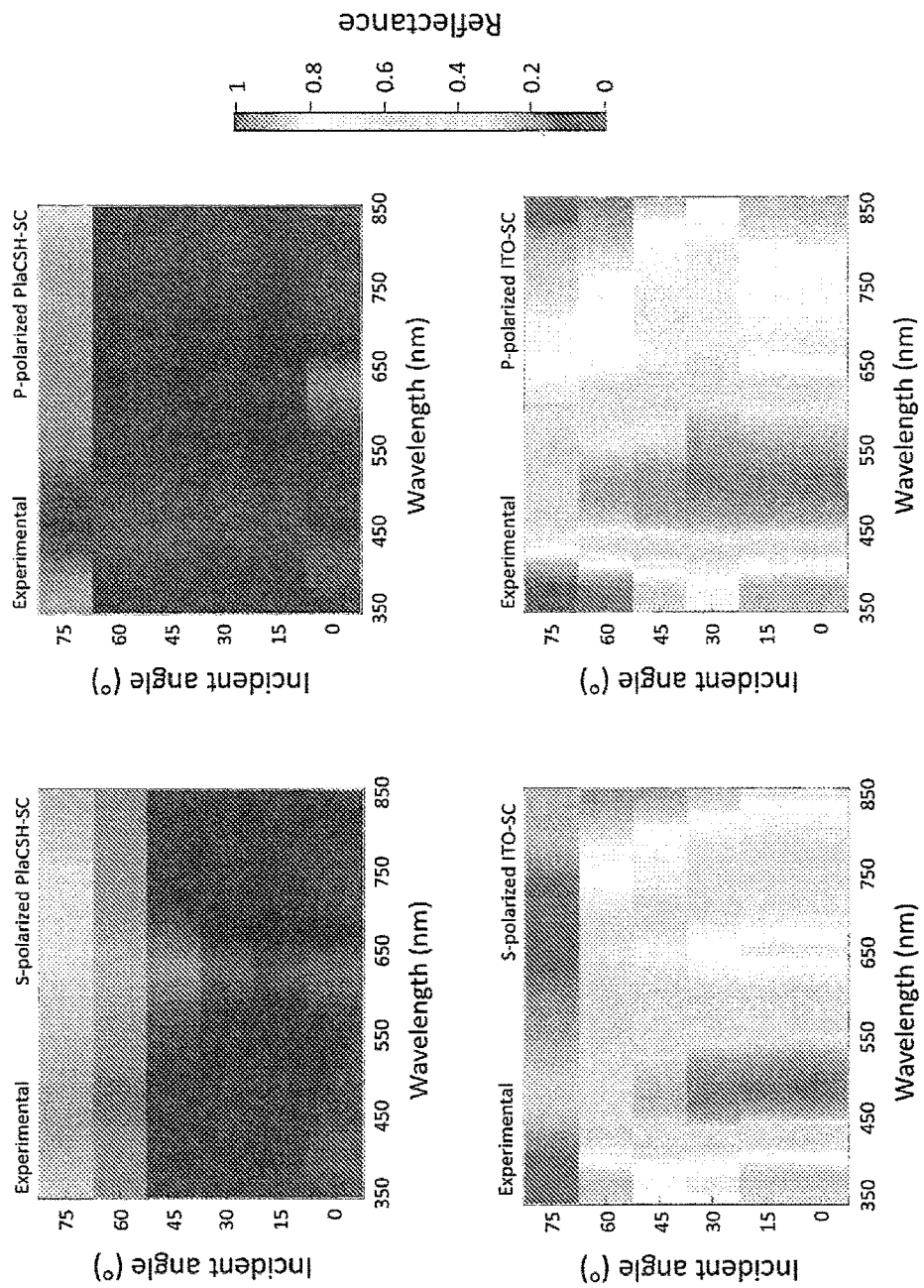
FIG. 21 are four charts illustrating Broad-band Omni acceptance in PlaCSH-SC. Reflectance spectra color map under a white light for PlaCSH-SC and ITO-SC. The property of PlaSCH-SC, that light coupling into solar cell is nearly independent of light polarization and incident angle over entire possible angle, is termed "Omni acceptance". The achieved high, board-band, Omni light acceptance of PlaCSH is 2 to 3 fold better than that of Si subwavelength antireflection, yet PlaCSH has a thickness over 10 fold thinner.

The angle and polarization dependence of the photocurrent is consistent with the measured angle and polarization dependence of the reflectance of PlaCSH-SC and ITO-SC (FIG. 20). To further study the angle dependence on reflection, we measured it using a polarized white light for the wavelength range from 350 to 850 nm (FIG. 21). Compared to ITO-SC, the light reflection (hence coupling into solar cell) in PlaCSH-SC is nearly independent of light polarization and incident angle over entire angle range measured. We term the property of as "Omni acceptance". The high, board-band, Omni light acceptance in PlaCSH-SC has made it look black under the Sun light, and is over 2 fold better than Si subwavelength antireflection (either roughed surfaces or periodic nanostructures) 49, 50 at high angles, yet PlaCSH has a thickness over 10 fold thinner.

Furthermore, we measured the incident angle and polarization dependence of light reflectance and transmittance of the substrate only (i.e., a fused silica). Our analysis of the data indicates that the angle and polarization dependence of reflectance for PlaCSH-SCs can be even smaller, if the light enters the solar cell without going through the glass substrate, which can be achieved by building the MESH on the top of PlaCSH-SC (Details will be published elsewhere).

Figure 23:
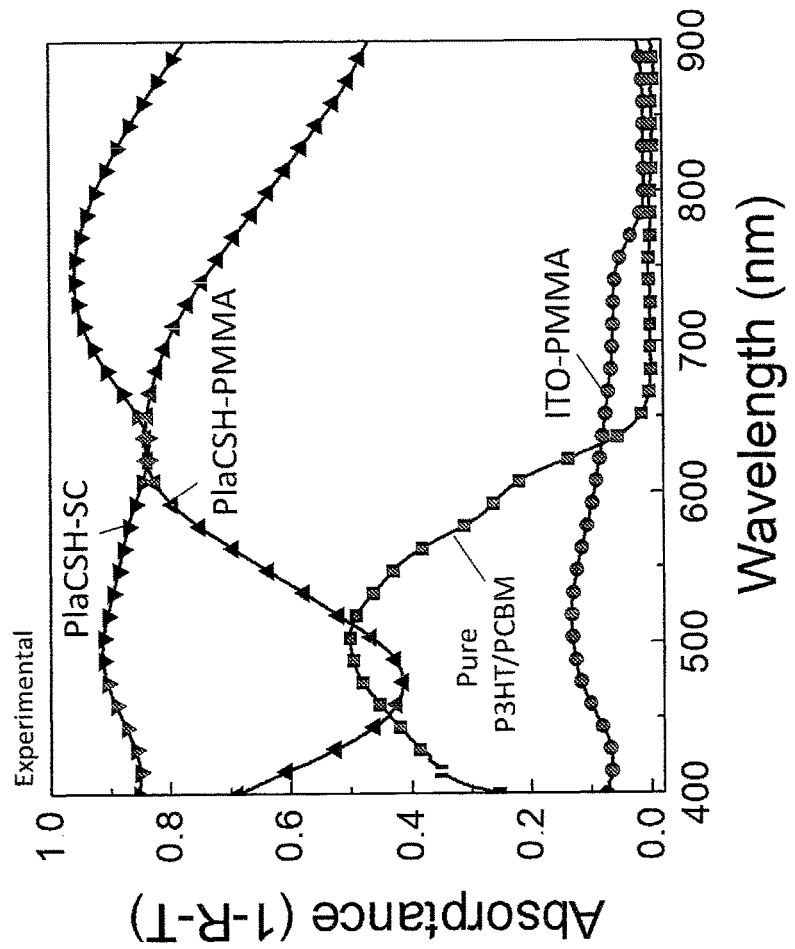
FIG. 23 is a chart illustrating a measured absorptance spectrum of MIM and Comparison with MAM. The measured absorptance spectrum of PlaCSH-SC (MESH/Absorbing active layer/Metal) and the structures same as PlaCSH-SC and ITO-SC except replacing the absorbing active layer (P3HT/PCBM) by PMMA of the same optical thickness (MESH/Insulating (lossless)/Metal). They show the absorbing layer changes the optical property of a plasmonic cavity significantly. Using of an absorbing layer changes a plasmonic cavity from narrow band to broadband, and increases the absorption substantially.

Comparison with MIM Cavity. To further study PlaCSH, we fabricated the structures same as the PlaCSH-SC and ITO-SC except replacing the photovoltaic active layer by a PMMA (polymethylmethacrylate) layer of 110 nm thick (the same optical thickness as 85 nm P3HT/PCBM); and measured their optical spectra (R, T, and A) in the wavelength range of 400 to 900 nm (FIG. 23). PMMA is an insulator and has little light absorption in the measured wavelength range. Thus the MAM cavity becomes a MIM cavity, while ITO/A/M cavity become ITO/I/M.

A comparison of the spectra shows (a) the ITO/PMMA/Al structure has a very small absorptance and a nearly flat spectrum, which are almost identical to the absorptance of ITO film. This indicates that PMMA indeed does not absorb much light in wavelength range tested, and that again the absorptance spectrum of ITO-SC is dominated by the active material (P3HT/PCBM). And (b) the PlaCSH with PMMA (a M/I/M cavity) has an absorptance spectrum drastically different from both PlaCSH-SC (a M/A/M cavity) and ITO/PMMA/Al (almost no cavity). Compared to ITO/

PMMA/Al, the absorptance of PlaCSH with PMMA is on average 9.4 times larger. The absorption enhancement is caused by light trapping in the MIM plasmonic cavity. Compared to PlaCSH-SC, the MIM cavity (PlaCSH with PMMA) has a smaller absorptance (except at 540 nm where they are equal) and a narrow bandwidth (rather than broad-band). And compared to pure P3HT/PCBM film, the MIM cavity has a peak absorption wavelength. These comparisons indicate that an MIM and an MAM are drastically different cavity; the replacing of the insulator in an MIM cavity with an absorbing material can significantly improve both the total cavity absorption and absorption bandwidth.

Figure 24:
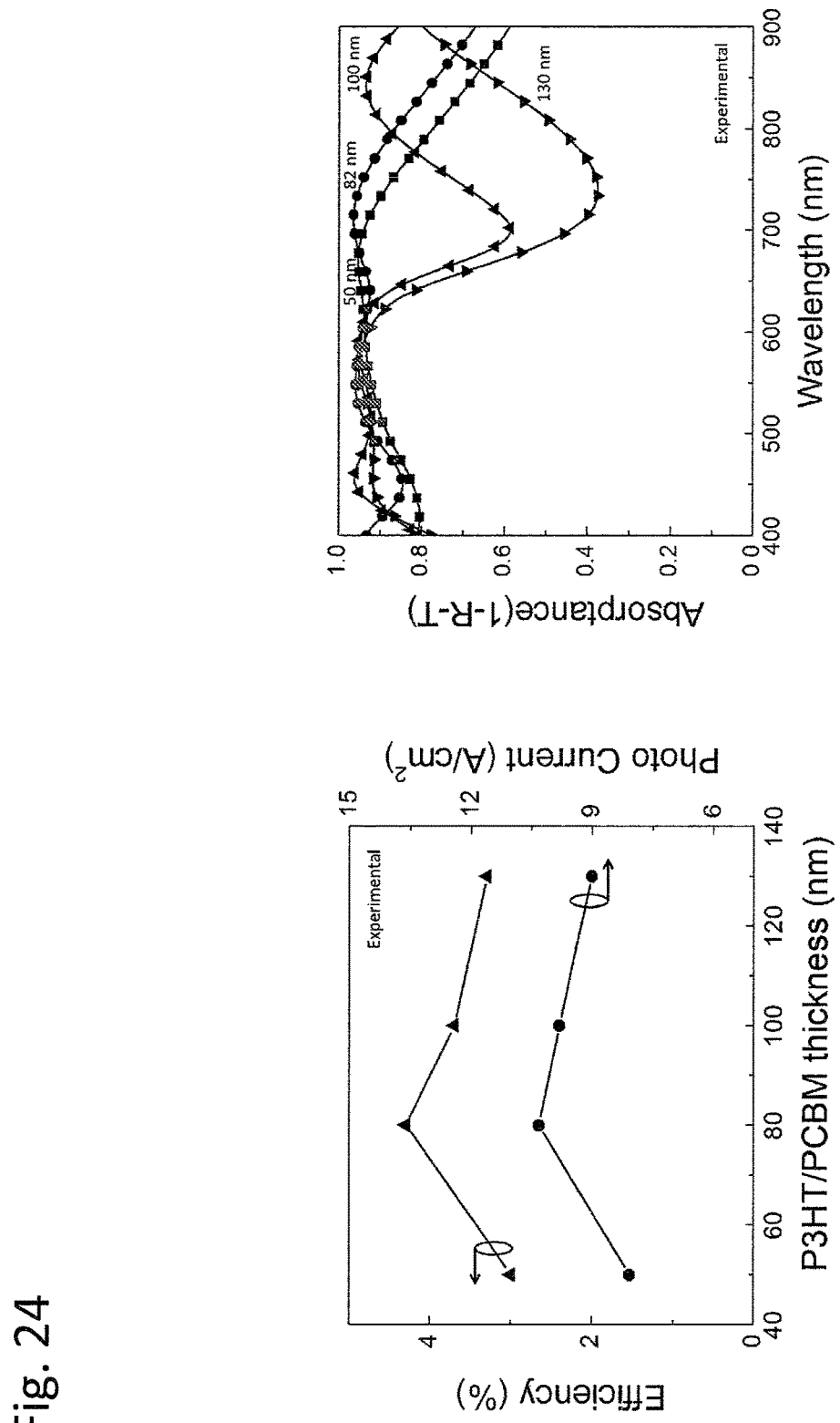
FIG. 24 are two charts illustrating Cavity Length Effect on efficiency, photocurrent, and absorptance of PlaCSH-SC. Experimental data on power conversion efficiency (a) and absorptance spectrum (b) for PlaCSH-SC with different P3HT/PCBM layer thickness of 50, 82, 100, and 130 nm, showing that the about 85 nm thickness gives the best performance.

Effects of PlaCSH Length. Clearly the cavity length of PlaCSH also plays an important role to PlaCSH-SC performance. By fabricating and testing PlaCSH-SCs with different P3HT/PCBM active layer thickness of 50, 82, 100, and 130 nm, we found that the highest photocurrent, the highest power conversion efficiency and a favorable absorption spectrum are achieved with 85 nm P3HT/PCBM thickness, while thinner or thicker thickness gives worse photocurrent, power conversion efficiency and absorption spectrum (FIG. 24). We attribute these effects primarily to the plasmonic cavity, where an optimized design can lead to (i) a better light coupling into the P3HT/PCBM active layer in a PlaCSH and (ii) an optimum interplay between light trapping and energy loss to heat inside the plasmonic-cavity, although the effect of cavity length on charge carrier diffusion in the polymer might also play a role.

PlaCSH-SC Operation Principle and Optimization. From the above experimental data and analysis, it is clear that a PlaCSH-SC uses a plasmonic cavity (consisting of MESH, polymer photovoltaic active layer, and back metal electrode) to greatly enhance the light coupling, trapping, and absorption in a sub-absorption-length active layer, while reducing the light reflectance and absorptance in MESH. The cavity effects depend on the properties of MESH, the active layer properties, and cavity length, which need to be considered together in PlaCSH-SC optimization. The current work has optimized only some of the key parameters.

Broad-Band Omni-Acceptance Effects on Scattering Light Harvesting. The broad-band Omni acceptance of PlaCSH-SC demonstrated here has significant impact to practical power conversion efficiency (PCE) in harvesting scattered light, which is dominant in cloudy days and in the morning and evening (Note: The effect of Omni acceptance to PCE is relatively small under the direct Sun light, where the light receiving is dominated by the light projection onto a flat solar-cell). We calculated the upper-limit of the additional PCE enhancement of PlaCSH-SC over ITO-SC due to Omni acceptance in detecting s-polarized and unpolarized scattered light for different material index, which is 81% (s-wave) and 41% (unpolarized) for the PlaCSH-SC using P3HT/PCBM (index of 2.2), and 142% and 61% for silicon PlaCSH-SC (index of 3.5).

When describing elements or features and/or embodiments thereof, the articles "a", "an", "the", and "said" are intended to mean that there are one or more of the elements or features. The terms "comprising", "including", and "having" are intended to be inclusive and mean that there may be additional elements or features beyond those specifically described.

Those skilled in the art will recognize that various changes can be made to the exemplary embodiments and implementations described above without departing from the scope of the disclosure. Accordingly, all matter contained in the above description or shown in the accompanying drawings should be interpreted as illustrative and not in a limiting sense.

It is further to be understood that the processes or steps described herein are not to be construed as necessarily requiring their performance in the particular order discussed or illustrated. It is also to be understood that additional or alternative processes or steps may be employed.

What is claimed is:

1. A photoelectron source comprising a photonic resonant cavity that comprises:
    i. a top metallic layer with a plurality of openings;
    ii. a bottom metallic layer; and
    iii. a photoelectron emission layer of semiconductor positioned between the top metallic layer and the bottom metallic layer,
    wherein:
    (a) the photoelectron emission layer generates photoelectrons after absorbing excitation photons coming from outside the photonic resonant cavity;
    (b) the incoming photons enter the photonic resonant cavity from the top metallic layer;
    (c) at least part of the photoelectrons are emitted from the photoelectron emission layer to outside the photonic resonant cavity through the opening in the top metallic layer;
    (d) the length of the cavity is configured to enhance the absorption of incoming excitation photons by the cavity; and
    (e) a majority of the openings have a dimension less than the vacuum wavelength of the incoming excitation photons.

2. The photoelectron source of claim 1, wherein each of the openings has a shape selected from the group consisting of round, polygon, and triangle or a superposition of one or more thereof.

3. The photoelectron source of claim 1, wherein the openings are the openings between a plurality of metallic disks.

4. The photoelectron source of claim 3 wherein the shape of the disks is selected from the group consisting of round, polygon, and triangle, or a superposition of one or more thereof.

5. The photoelectron source of claim 1 wherein the top metallic layer has a thickness at least a factor of 2 smaller than the wavelength of the excitation photons in vacuum.

6. The photoelectron source of claim 1 wherein the top metallic layer has a thickness about 15 to about 40 nm.

7. The photoelectron source of claim 1 wherein the top metallic layer or the bottom metallic layer is composed of metals selected from the group consisting of a single metal, a mixture of a plurality of metals, and a plurality of layers of two or more metals.

8. The photoelectron source of claim 1 wherein the photoelectron emission layer comprises a semiconductor (organic and inorganic, elements or compounds), which generates electrons upon irradiation of incoming photons.

9. The photoelectron source of claim 1 wherein the photoelectron emission layer is composed of a material selected from the group consisting of Gallium Arsenide (GaAs), Gallium Nitride (GaN), Silicon (Si).

10. The photoelectron source of claim 1 wherein the photoelectron emission layer is composed of one or more materials selected from the group consisting of a single material, a mixture of a plurality of semiconductors, and multiple layers of a plurality of semiconductors.

11. The photoelectron source of claim 1 wherein the photoelectron emission layer includes a coating material on a surface of the photoelectron emission layer facilitating the photoelectron escaping to outside of the photoelectron emission layer.

12. The photoelectron source of claim 11 wherein the coating material is cesium.

13. The photoelectron source of claim 1 wherein the photoelectron emission layer has a short carrier lifetime for the photoelectrons generated by the excitation photons.

14. The photoelectron source of claim 1 wherein the photoelectron emission layer has a thin thickness that is configured to reduce the pulse width of the photoelectrons generated by the incoming photons.

15. The photoelectron source of claim 1 wherein the photoelectron emission layer has a thickness from about 2 nm to about 300 nm.

16. The photoelectron source of claim 1 wherein the photoelectron emission layer has a charge carrier lifetime of about 0.01 ps to about 1 ns.

17. The photoelectron source of claim 1 wherein the photonic resonant cavity further comprises an interface layer positioned either between the photoelectron emission layer and the top metallic layer, or the photoelectron emission layer and the bottom metallic layer.

18. The photoelectron source of claim 1 wherein the excitation photons are generated by the sources selected from the group consisting of a laser, an LED, and a lamp, and are either pulsed or continuums.

19. The photoelectron source of claim 1 wherein the excitation photons are pulsed with a pulse width of about 0.01 ps to about 1 ns.

20. The photoelectron source of claim 1 wherein the photoelectron emission layer is fabricated by thin film deposition.

21. The photoelectron source of claim 1, wherein the openings have an average distance between two nearest neighbor openings smaller than the wavelength of the excitation photons.

22. The photoelectron source of claim 1, wherein the openings has an average distance between two nearest neighbor openings is about 200 nm for the excitation photons of 800 nm wavelength.

23. The photoelectron source of claim 1, wherein the openings are arranged periodically.

24. The photoelectron source of claim 1, wherein the top metallic layer has a thickness of about 1 nm to about 100 nm.

25. The photoelectron source of claim 1, wherein the photoelectron emission layer has a thickness less than a wavelength of the excitation photons.

26. The photoelectron source of claim 1, wherein the top metallic layer and the bottom metallic layer are composed of one or more materials, mixtures of material, alloys and/or layers of materials selected from the group consisting of gold, copper, silver, and aluminum.

27. The photoelectron source of claim 1, wherein the photoelectron emission layer comprise a semiconductor material grown by a low temperature molecule beam epitaxy.

28. The photoelectron source of claim 1, wherein the photoelectron emission layer has a thickness from about 40 nm to about 100 nm.

29. The photoelectron source of claim 1, wherein an electric potential is applied to the bottom or top metallic layer or both.

30. The photoelectron source of claim 1, wherein the excitation photons have a wavelength from about 1 nm to about 30 um.

31. The photoelectron source of claim 1, wherein the photoelectron source further comprises an electron extractor spaced apart from the top metallic layer and exerting an electric field that enhances the escape of the photoelectrons from the photonic resonant cavity.

32. The photoelectron source of claim 31, wherein the electron extractor is powered by DC power supply.

33. The photoelectron source of claim 1, wherein the photoelectron source further comprises a chamber that has a vacuum and wherein the photonic resonant cavity is positioned within the chamber.

34. A method of use the photoelectron source of claim 1, wherein the photoelectron source provides the photoelectrons to a system selected from the group consisting of an electron microscopy, an electron metrology, an electron beam lithography, and an x-ray.

35. The photoelectron source of claim 1, wherein the distance between two neighboring openings is less than the vacuum wavelength of the excitation photons.

36. The photoelectron source of claim 1, wherein the excitation photons have a wavelength in a range from 400 nm to 900 nm.

37. The photoelectron source of claim 1, wherein a majority of the openings have a diameter of about 180 nm.

38. The photoelectron source of claim 1, wherein a majority of the openings have a diameter in a range from about 20 nm to about 75 nm.

39. The photoelectron source of claim 1, wherein the openings are arranged periodically and the periodicity is about 50 nm to about 500 nm.

40. The photoelectron source of claim 1, wherein the openings have an average distance between two nearest neighbor openings that is smaller than the wavelength of the excitation photons.

41. A method of manufacturing the photoelectron source comprising:
 having a photoelectron emission layer;
 having a top metallic layer that has a plurality of openings and is light transmissive; and
 having a bottom metallic layer;
 wherein the top metallic layer, the bottom metallic layer, and the photoelectron emission layer in between form a photonic resonant cavity that can resonantly absorb the excitation photons;
 wherein:
 (a) the photoelectron emission layer generates photoelectrons after absorbing excitation photons coming from outside the photonic resonant cavity;
 (b) the incoming photons enter the photonic resonant cavity from the top metallic layer;
 (c) at least part of the photoelectrons are emitted from the photoelectron emission layer to outside the photonic resonant cavity through the opening in the top metallic layer;
 (d) the length of the cavity is configured to enhance the absorption of incoming excitation photons by the cavity; and
 (e) a majority of the openings have a dimension less than the vacuum wavelength of the incoming excitation photons.

42. The method of manufacturing a photoelectron source of claim 41, wherein the top metallic layer is fabricated by at least one method selected from the group of nanoimprinting, electron beam lithography, ion beam lithography, optical lithography, and self-photoelectron source.

43. The method of manufacturing a photoelectron source of claim 41, wherein the photoelectron emission layer is fabricated by lift-off of a thin-film from a substrate.

44. The method of manufacturing a photoelectron source of claim 41, comprising growing the photoelectron emission layer using a low temperature molecule beam epitaxy.

\* \* \* \* \*